United States Patent
Huang et al.

(10) Patent No.: US 12,482,743 B2
(45) Date of Patent: Nov. 25, 2025

(54) INTERCONNECT STRUCTURE AND METHOD FOR FORMING THE SAME

(71) Applicant: TAIWAN SEMICONDUCTOR MANUFACTURING COMPANY, LTD., Hsinchu (TW)

(72) Inventors: Hsin-Yen Huang, New Taipei (TW); Shao-Kuan Lee, Kaohsiung (TW); Cheng-Chin Lee, Taipei (TW); Hai-Ching Chen, Hsinchu (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/649,522

(22) Filed: Apr. 29, 2024

(65) Prior Publication Data
US 2024/0290712 A1    Aug. 29, 2024

Related U.S. Application Data

(60) Continuation of application No. 17/571,029, filed on Jan. 7, 2022, now Pat. No. 12,002,750, which is a
(Continued)

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76816* (2013.01); *H01L 21/76877* (2013.01);
(Continued)

(58) Field of Classification Search
CPC .......... H01L 23/5226; H01L 21/76816; H01L 21/76877; H01L 23/5283; H01L 21/76829; H01L 21/76834; H01L 21/7685; H01L 21/76856; H01L 21/76897; H01L 21/76885; H10D 30/024; H10D 30/62
See application file for complete search history.

(56) References Cited

U.S. PATENT DOCUMENTS

| 6,287,958 B1 | 9/2001 | Reinberg |
| 8,193,087 B2 | 6/2012 | Shih et al. |

(Continued)

FOREIGN PATENT DOCUMENTS

| KR | 2019-0055395 A | 5/2019 |
| KR | 10-2021-0004231 A | 1/2021 |

*Primary Examiner* — Samuel Park
(74) *Attorney, Agent, or Firm* — Birch, Stewart, Kolasch & Birch, LLP

(57) ABSTRACT

An interconnect structure is provided. The interconnect structure includes a first metal line and a second metal line in a first dielectric layer, a catalyst layer on the first dielectric layer, a dielectric block on the catalyst layer, an etching stop layer along the second metal line, the catalyst layer and the dielectric block, a second dielectric layer over the etching stop layer, and a first via through the second dielectric layer and the etching stop layer on the first metal line. A first interface between the etching stop layer and the second metal line is level to a second interface between the catalyst layer and the first dielectric layer.

20 Claims, 21 Drawing Sheets

Related U.S. Application Data division of application No. 16/571,805, filed on Sep. 16, 2019, now Pat. No. 11,222,843.

(51) Int. Cl.
 *H01L 23/528* (2006.01)
 *H10D 30/01* (2025.01)
 *H10D 30/62* (2025.01)

(52) U.S. Cl.
 CPC ....... *H01L 23/5283* (2013.01); *H10D 30/024* (2025.01); *H10D 30/62* (2025.01)

(56) References Cited

U.S. PATENT DOCUMENTS

| | | |
|---|---|---|
| 10,651,122 B1 | 5/2020 | Bao et al. |
| 2003/0089928 A1 | 5/2003 | Saito et al. |
| 2004/0121571 A1 | 6/2004 | Uchikoshi et al. |
| 2006/0046518 A1 | 3/2006 | Hill et al. |
| 2015/0349023 A1 | 12/2015 | Debord et al. |
| 2016/0027689 A1* | 1/2016 | Wang ................ H01L 21/76883 438/666 |
| 2016/0093566 A1* | 3/2016 | Ting ................. H01L 21/76808 438/643 |
| 2016/0118335 A1* | 4/2016 | Lee .................. H01L 23/53266 257/774 |
| 2017/0125340 A1* | 5/2017 | Tsai ................. H01L 21/02178 |
| 2018/0076140 A1* | 3/2018 | Kim ................. H01L 21/76814 |
| 2018/0358262 A1* | 12/2018 | Lu .................... H01L 21/76897 |
| 2019/0148289 A1 | 5/2019 | Seo et al. |
| 2019/0305098 A1 | 10/2019 | Ahn et al. |
| 2020/0144103 A1 | 5/2020 | Kim et al. |
| 2020/0328251 A1 | 10/2020 | Dutta et al. |
| 2021/0005548 A1* | 1/2021 | Lee .................... H01L 23/5226 |
| 2021/0013095 A1 | 1/2021 | Tran et al. |
| 2021/0043828 A1 | 2/2021 | Hong et al. |

* cited by examiner

INTERCONNECT STRUCTURE AND METHOD FOR FORMING THE SAME

PRIORITY CLAIM AND CROSS-REFERENCE

This application is a Continuation Application of U.S. application Ser. No. 17/571,029, filed on Jan. 7, 2022, entitled "INTERCONNECT STRUCTURE," which is a divisional application of U.S. patent application Ser. No. 16/571,805, filed on Sep. 16, 2019 (now U.S. Pat. No. 11,222,843), entitled of "INTERCONNECT STRUCTURE AND METHOD FOR FORMING THE SAME," which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
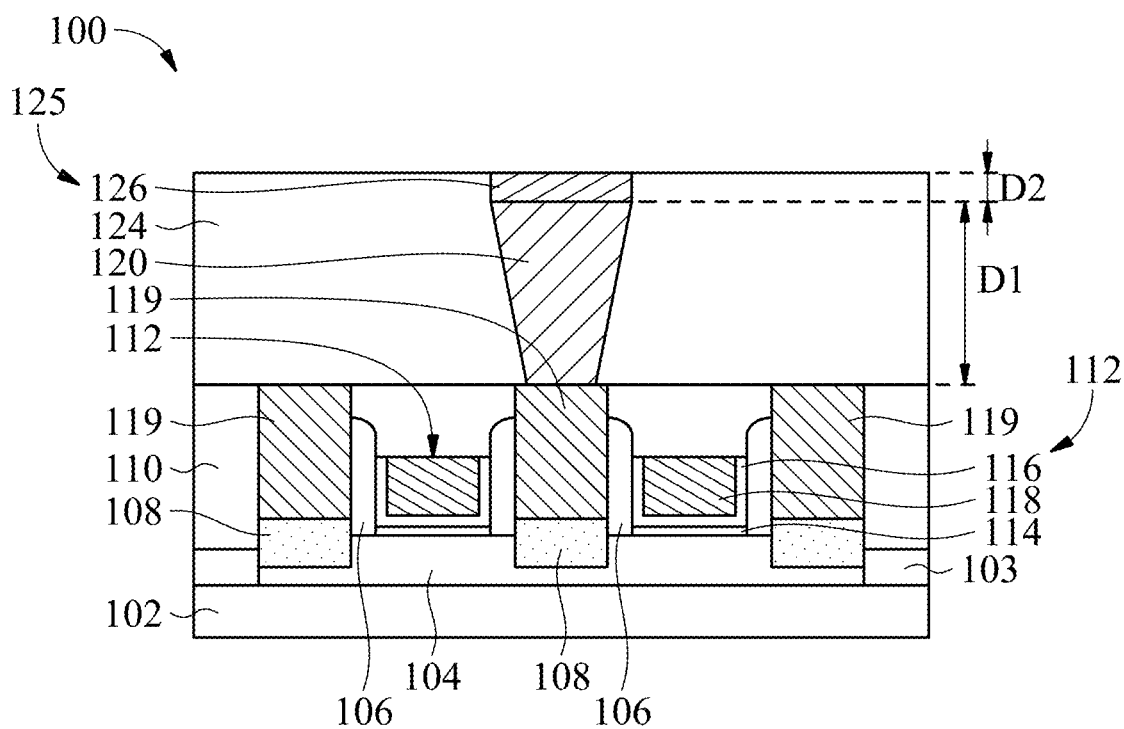
FIGS. 1A-1N are cross-sectional views illustrating the formation of a semiconductor device at various intermediate stages, in accordance with some embodiments of the disclosure.

The following disclosure provides many different embodiments, or examples, for implementing different features of the subject matter provided. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of an interconnect structure of a semiconductor device are provided. The interconnect structure may include a metal line through the first IMD layer, a dielectric block aligned over the first dielectric layer, an etching stop layer along an upper surface and a sidewall of the dielectric block, a second IMD layer over the etching stop layer; and a via extending through the second IMD layer, the etching stop layer, and the dielectric block to the metal line. As a result, the via-to-line overlay window, the via critical dimension (CD) control window, and the time-dependent dielectric breakdown (TDDB) window of the semiconductor device may be improved, which enhances the reliability of the semiconductor device.

Figure 1B:
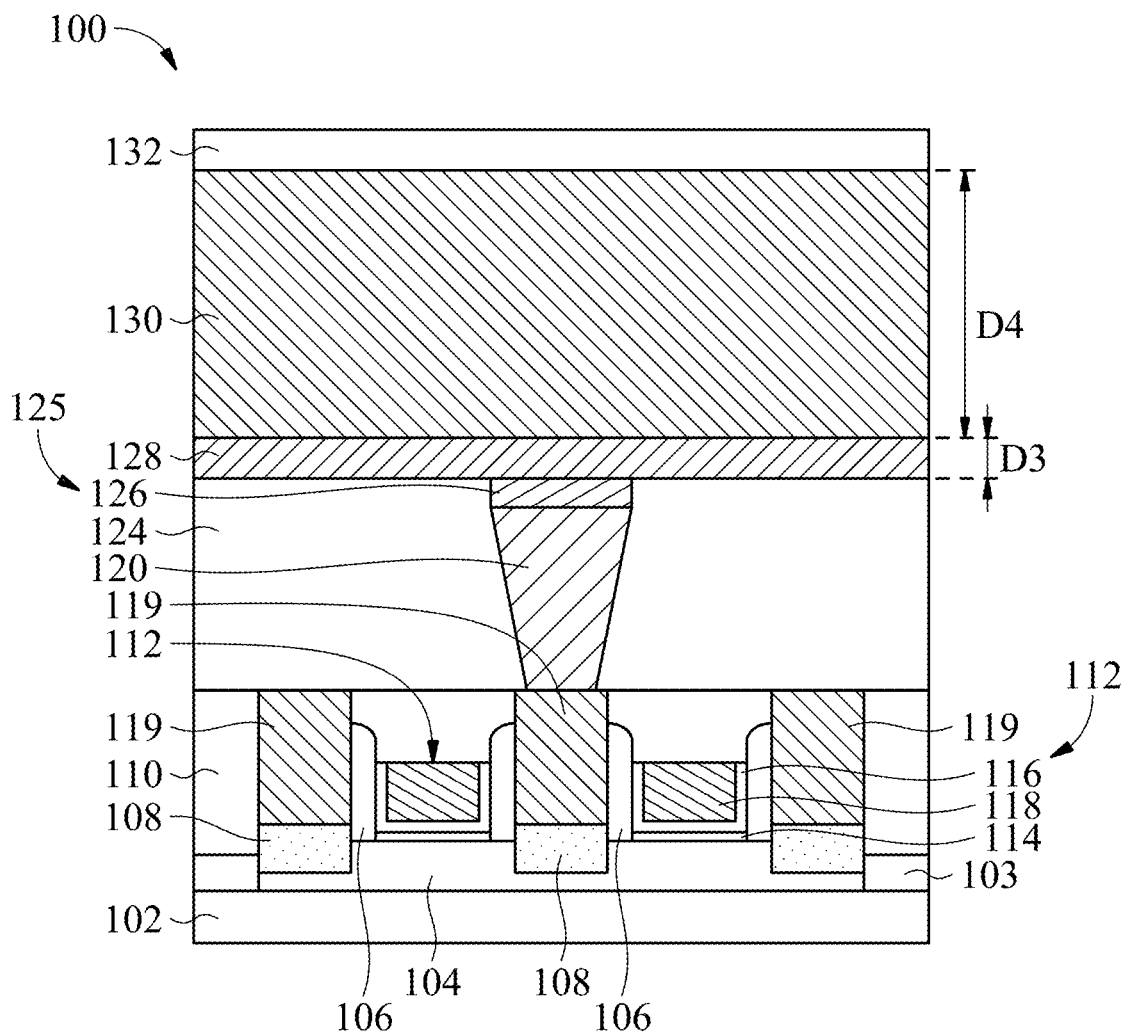
Figure 1C:
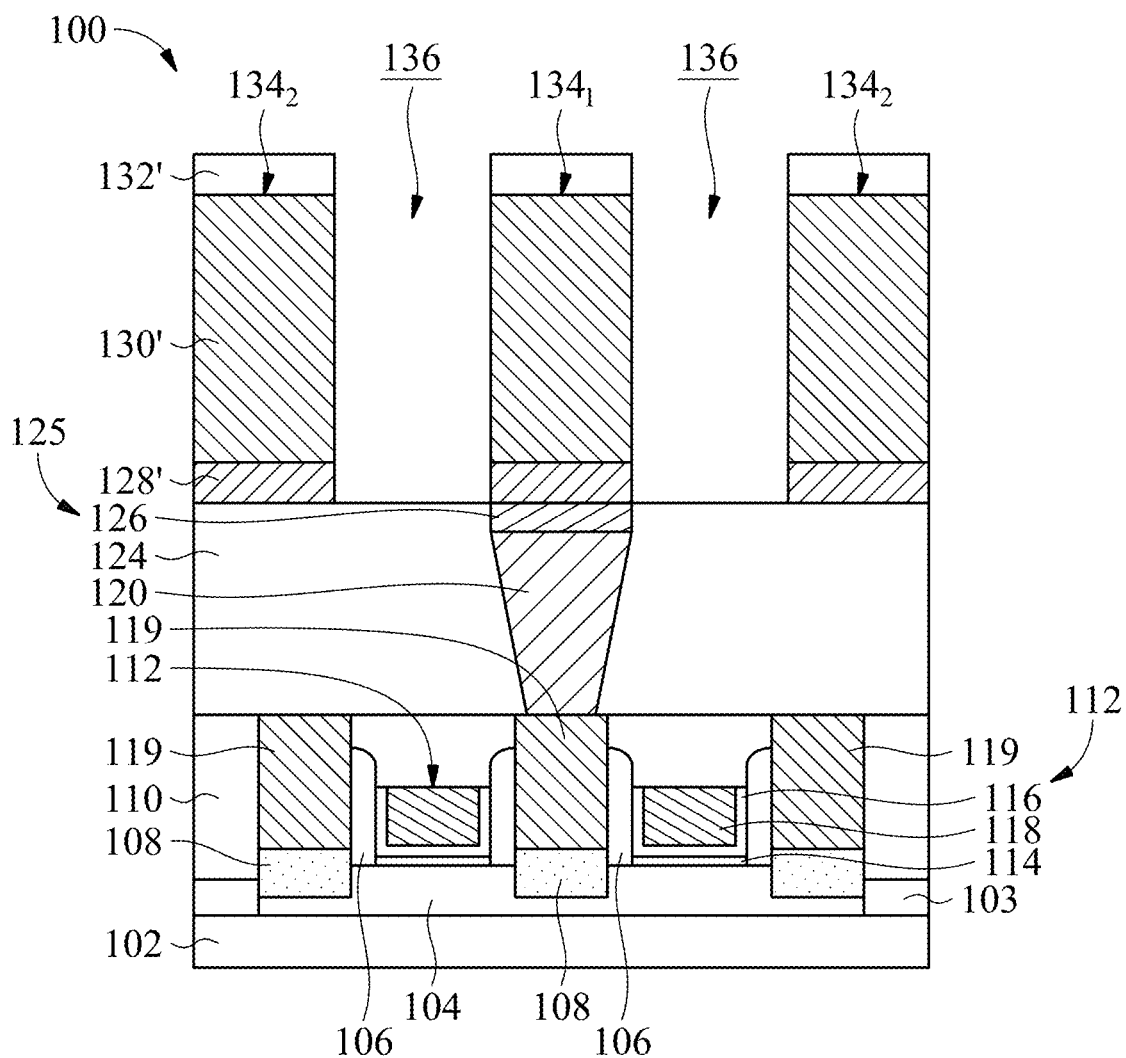
Figure 1D:
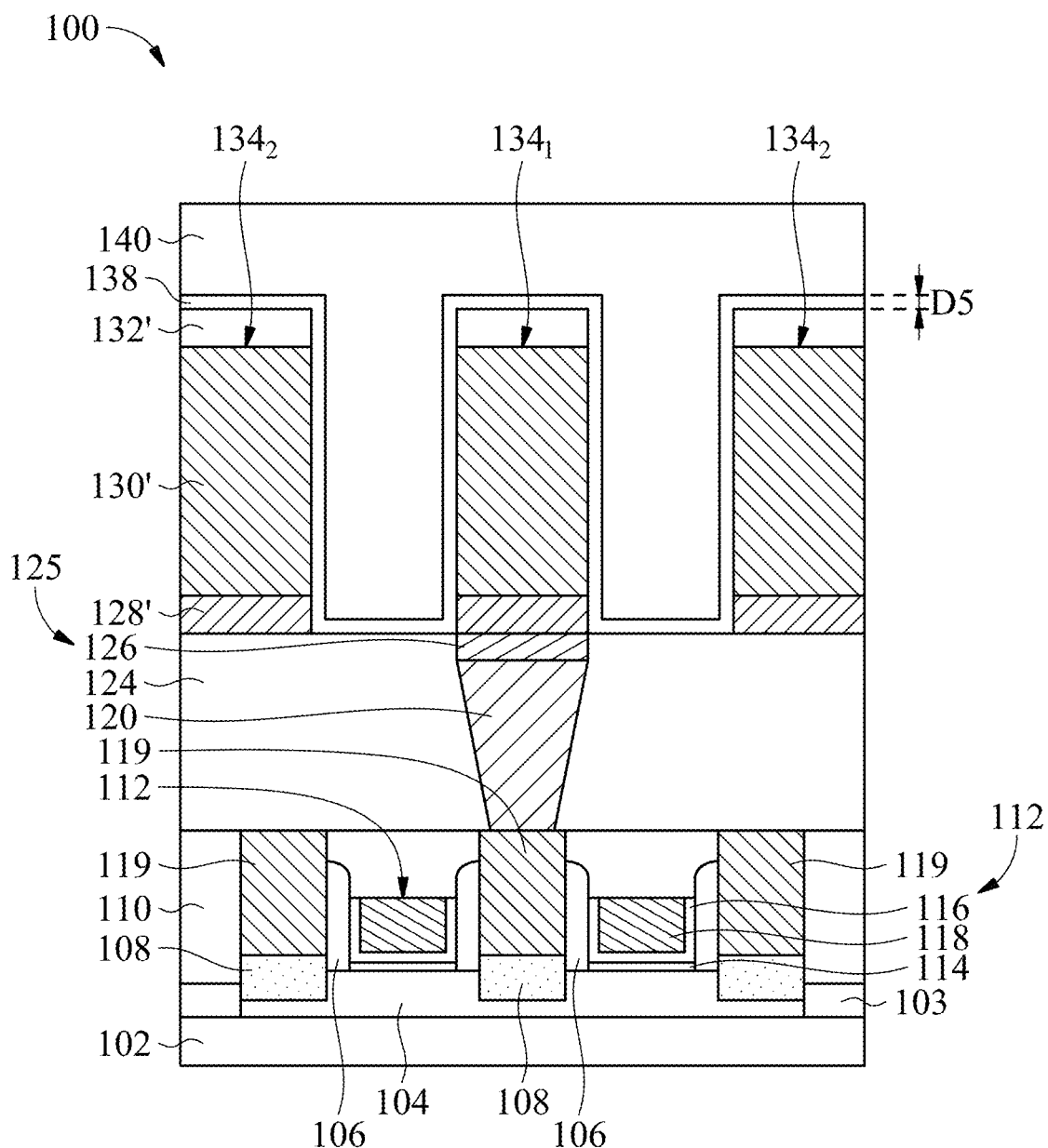
Figure 1E:
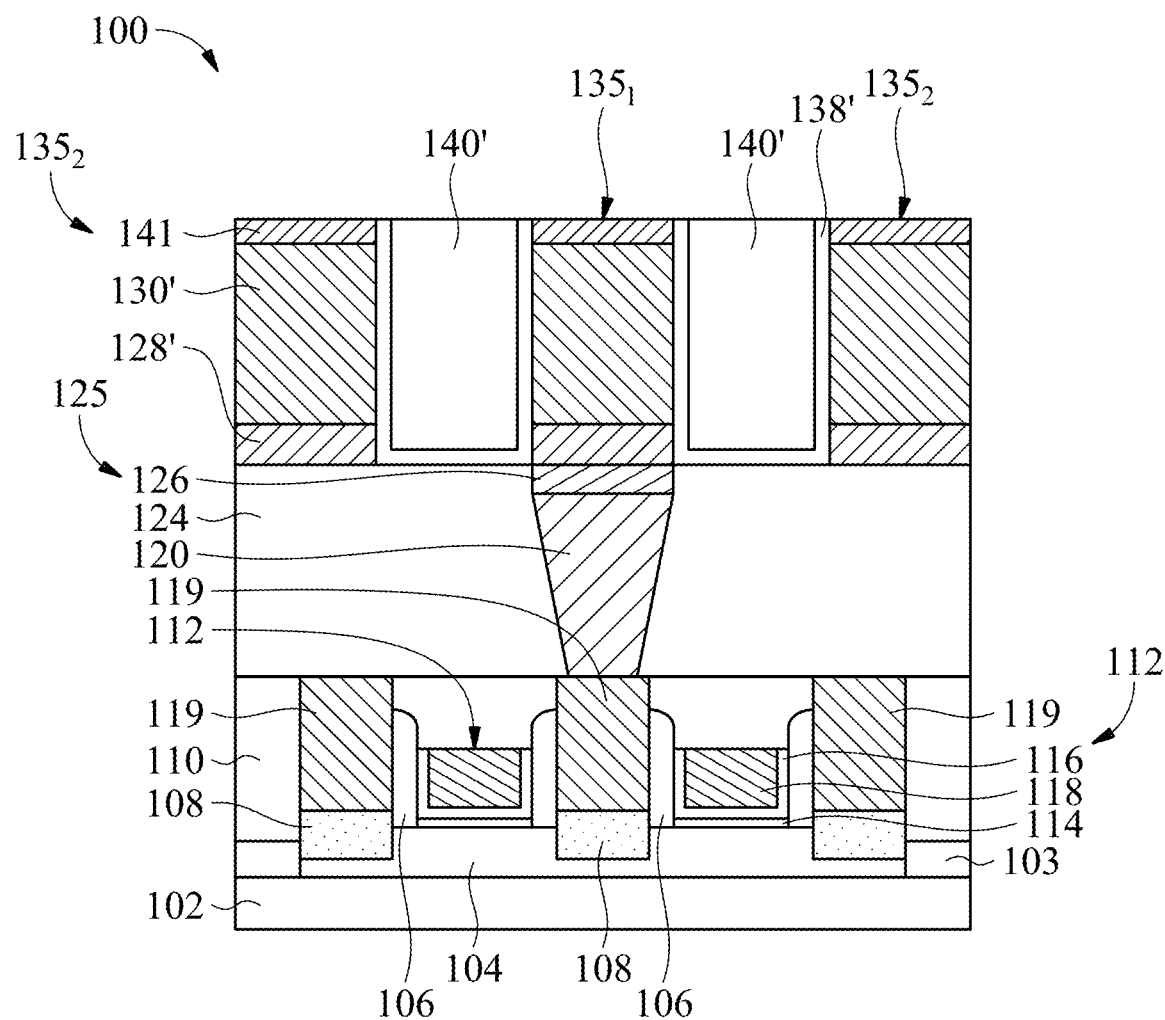
Figure 1F:
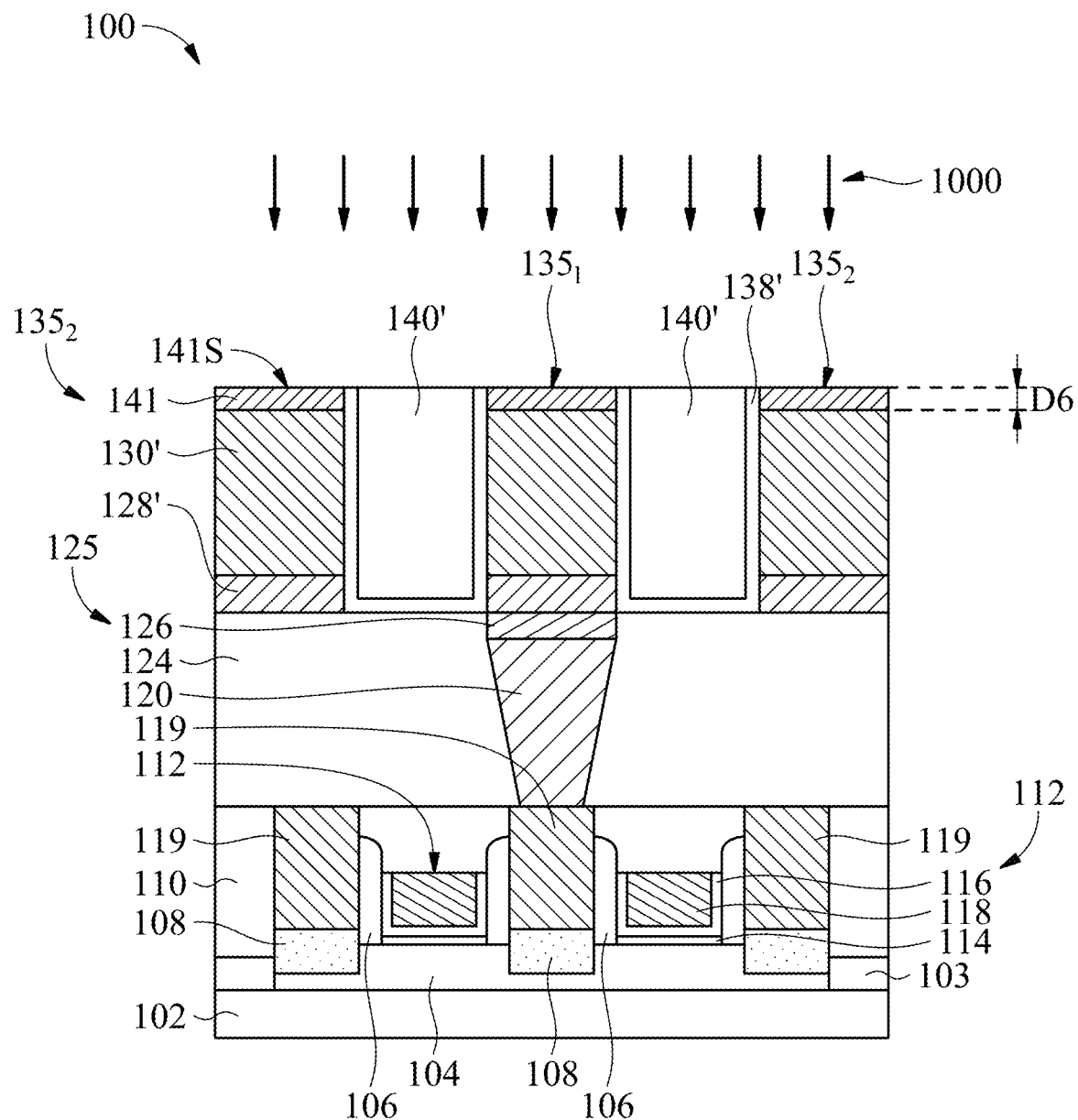
Figure 1G:
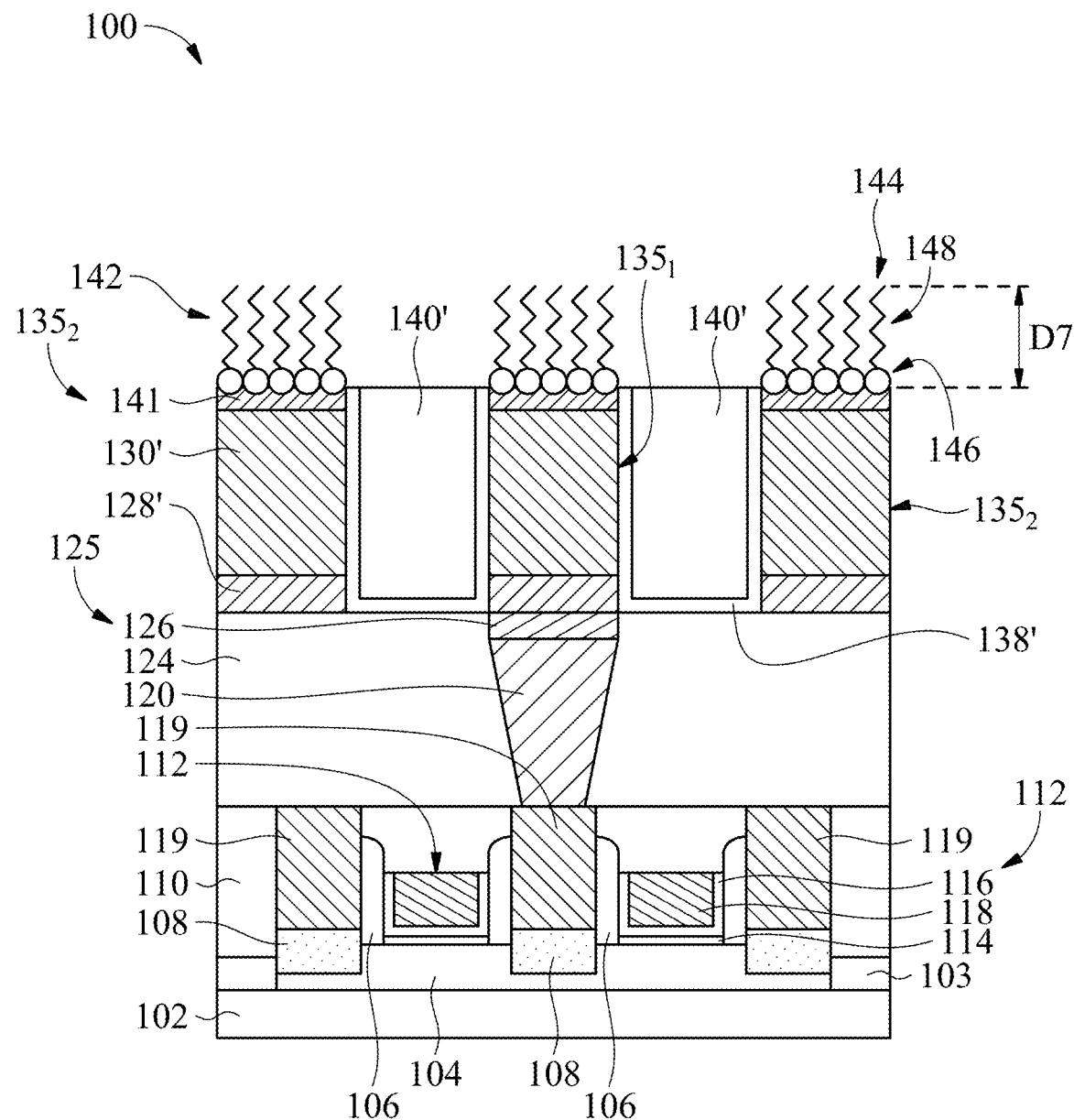
Figure 1H:
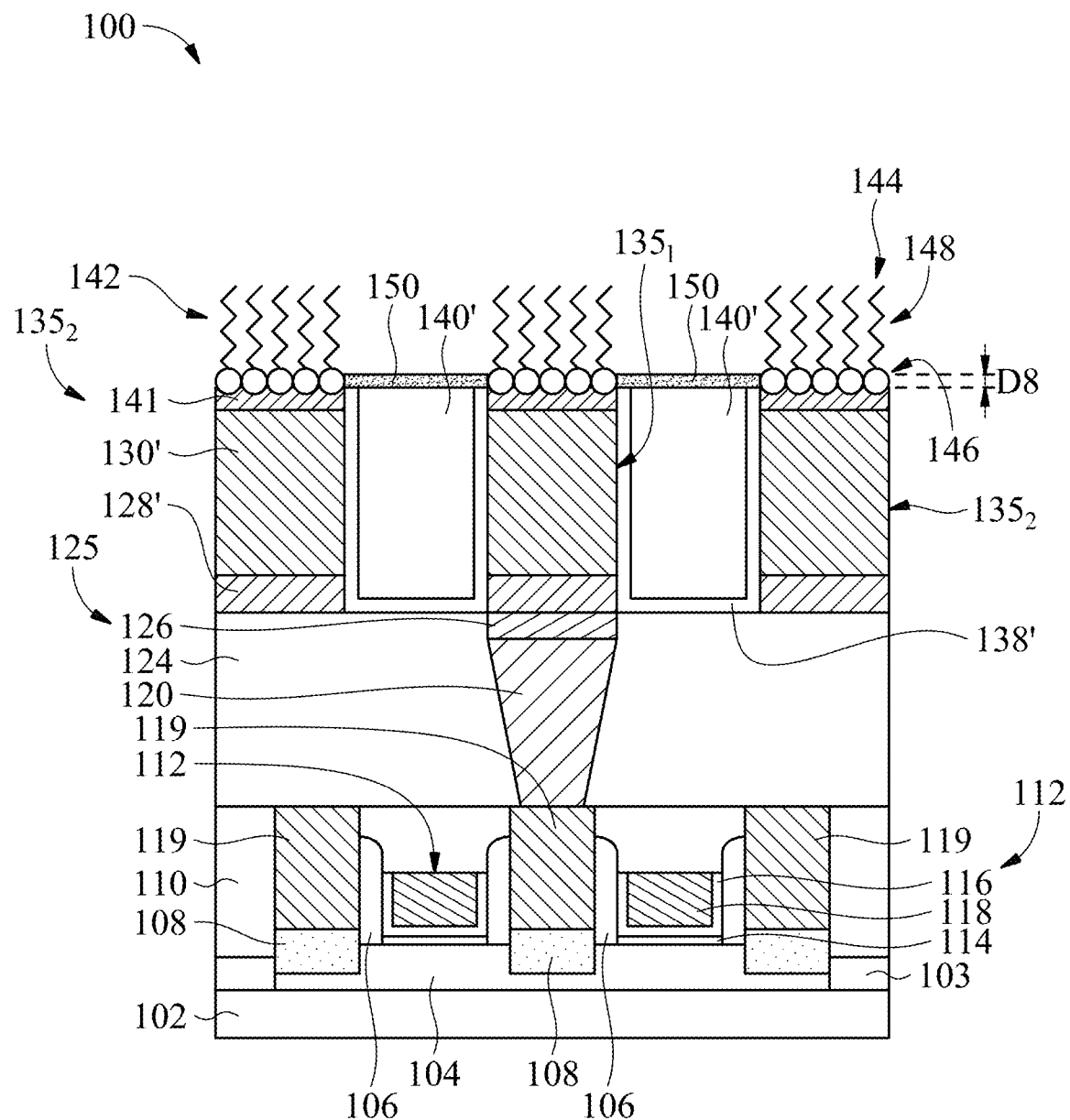
Figure 1I:
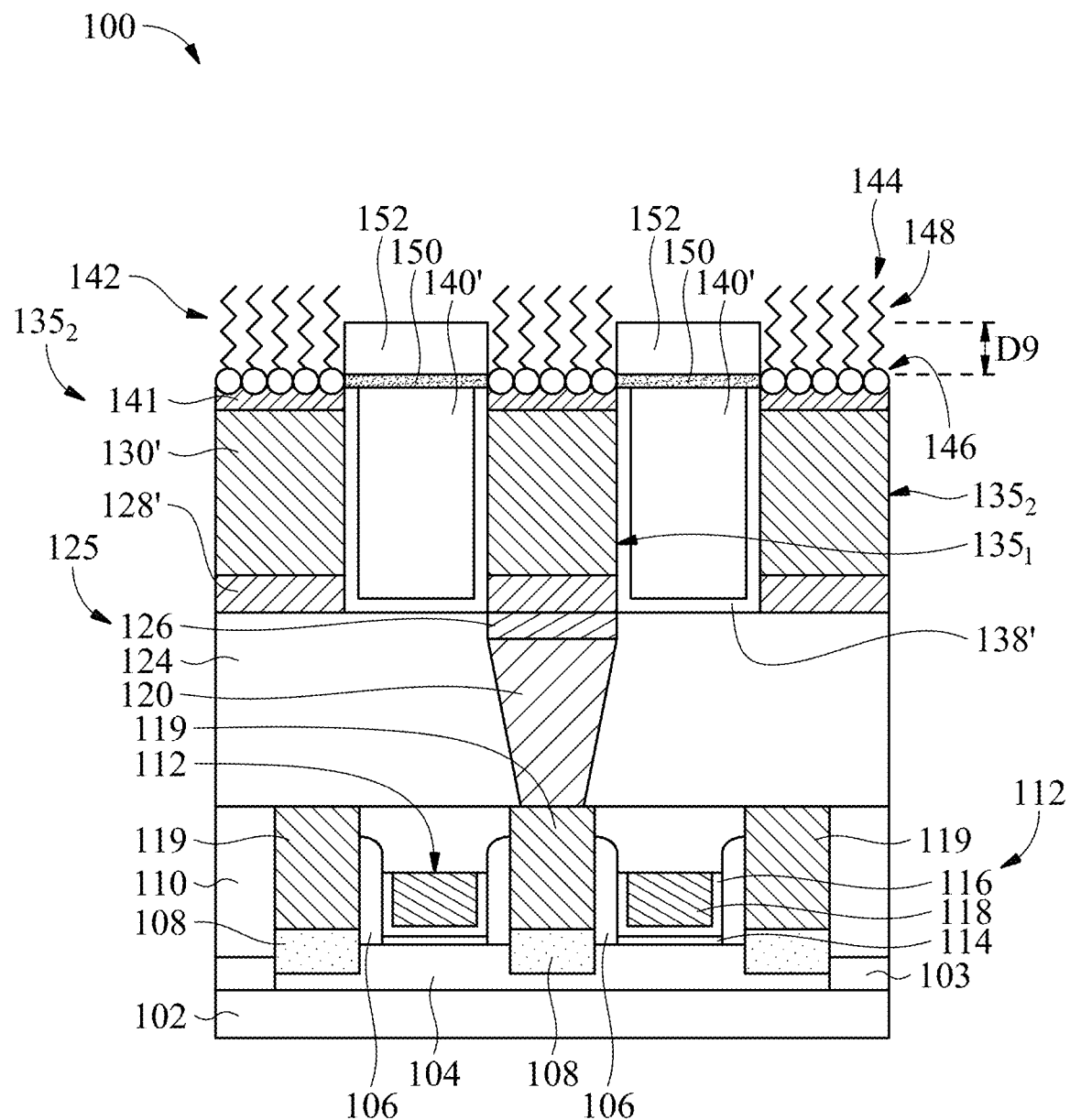
Figure 1J:
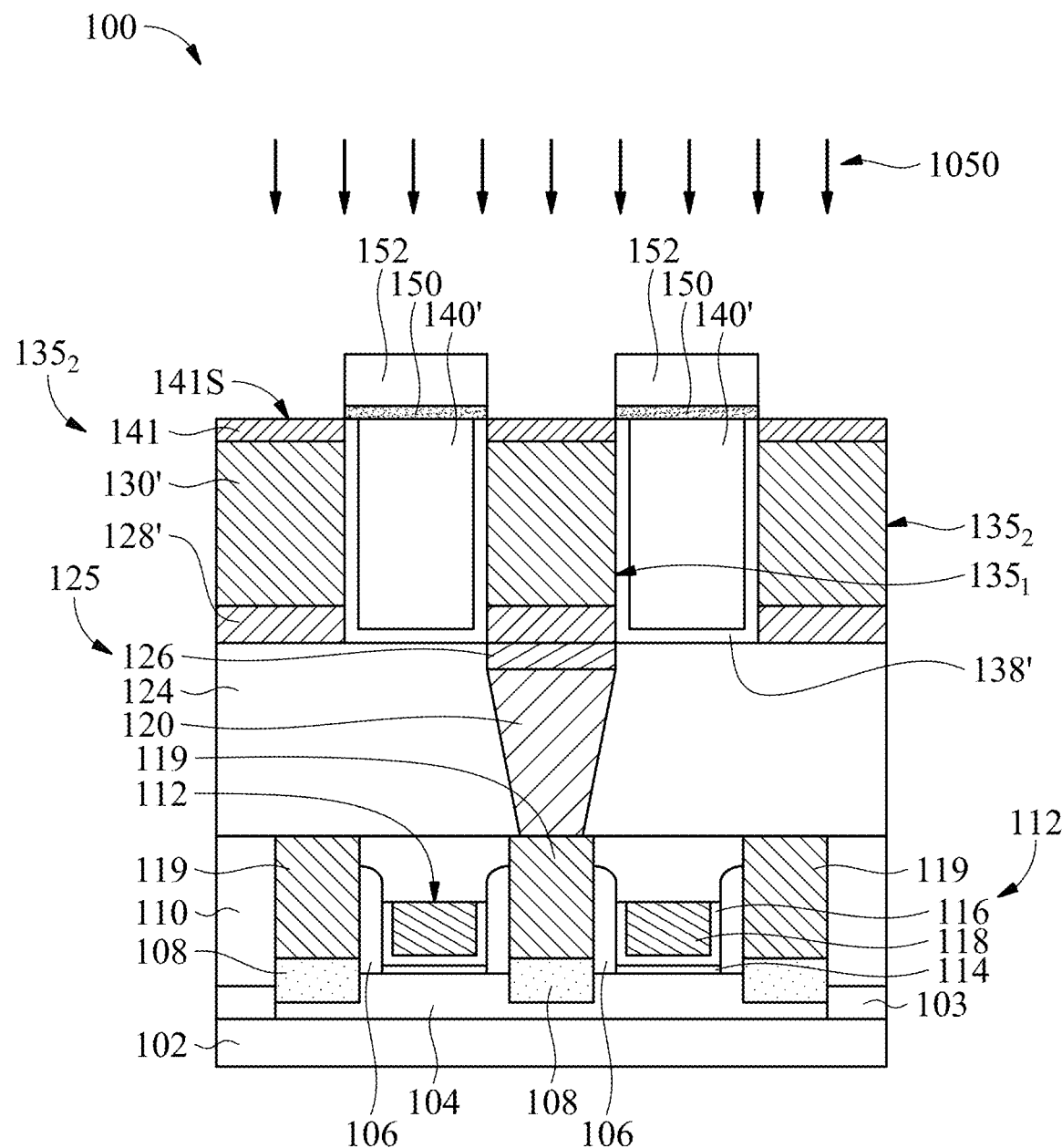
Figure 1K:
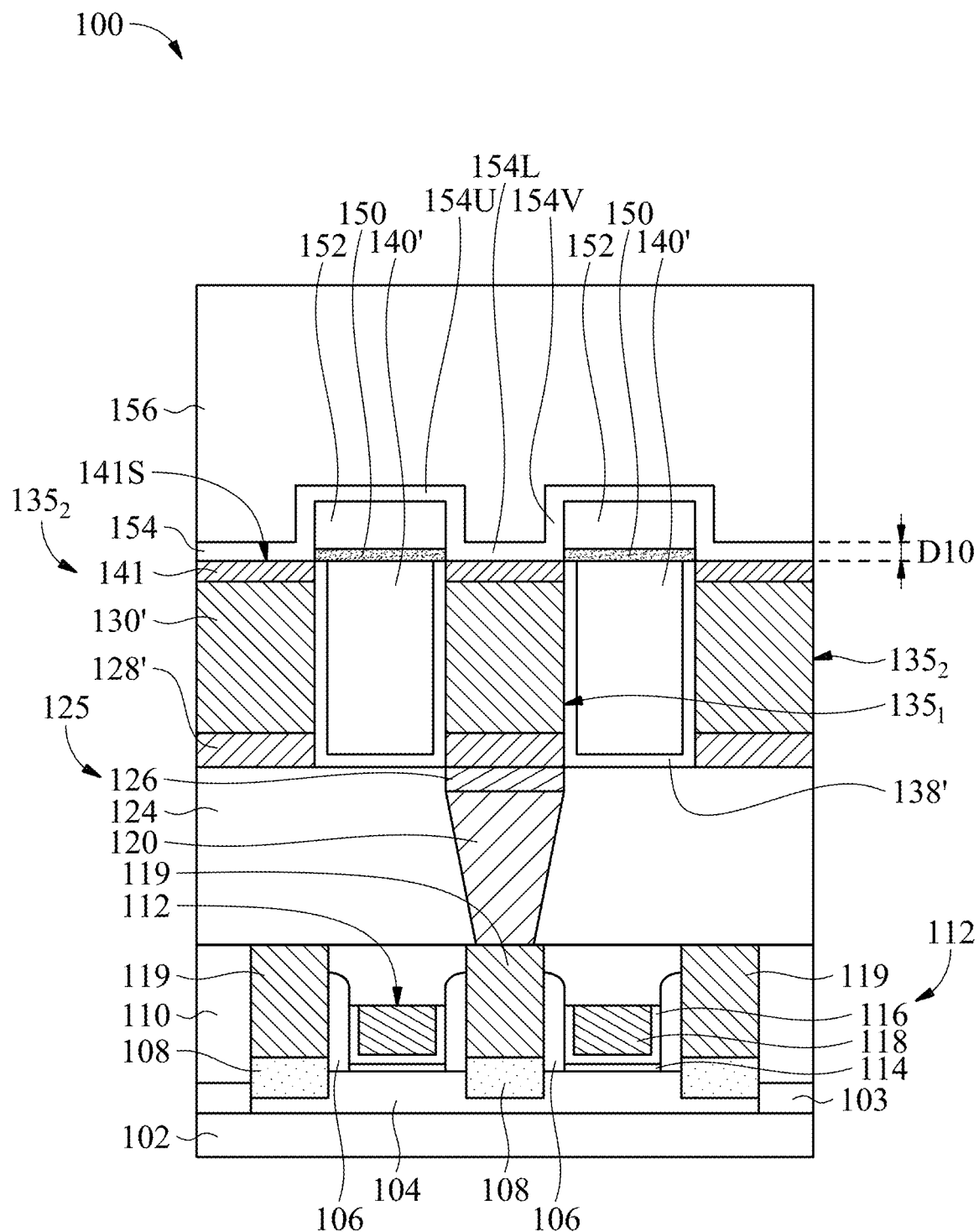
Figure 1L:
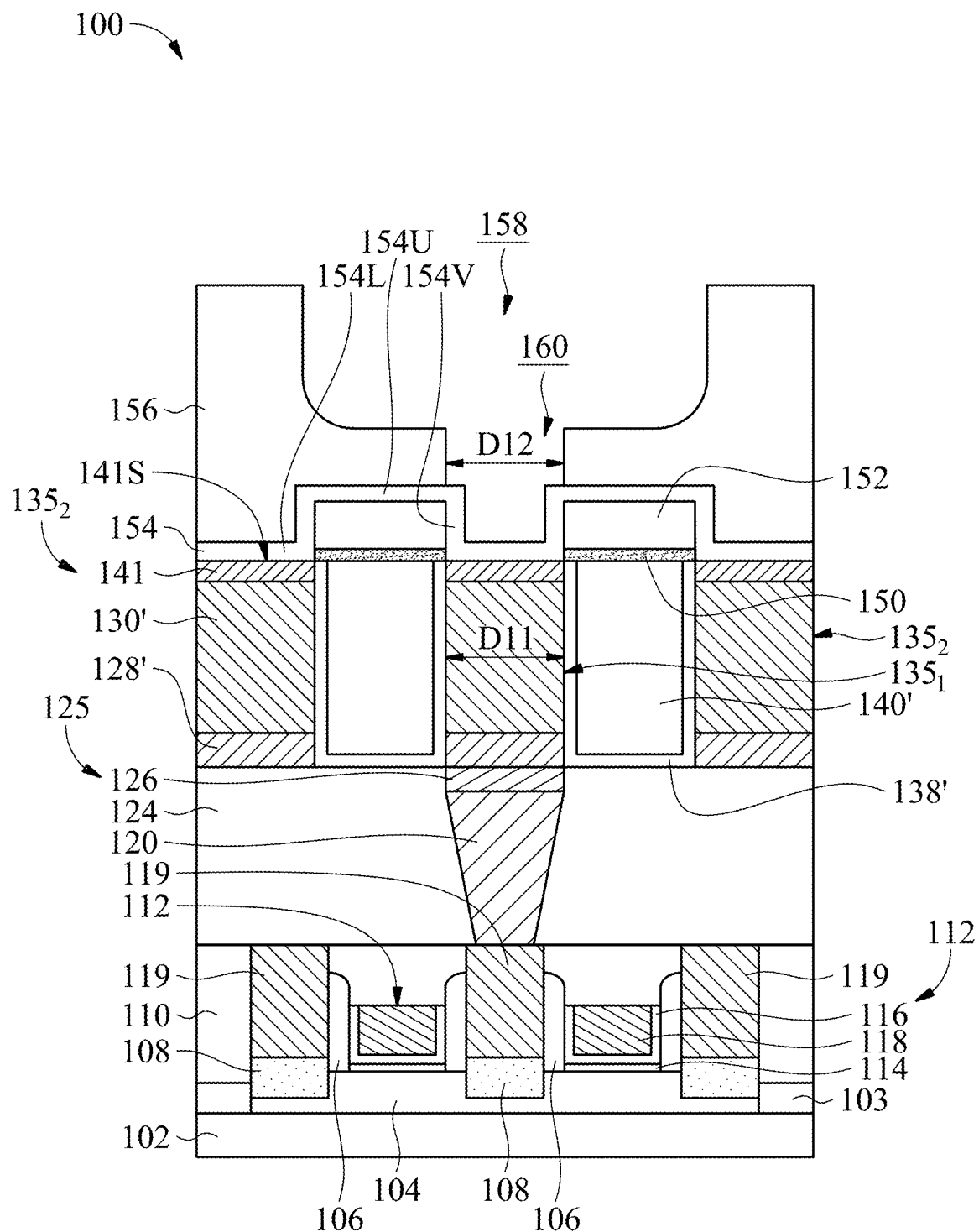
Figure 1M:
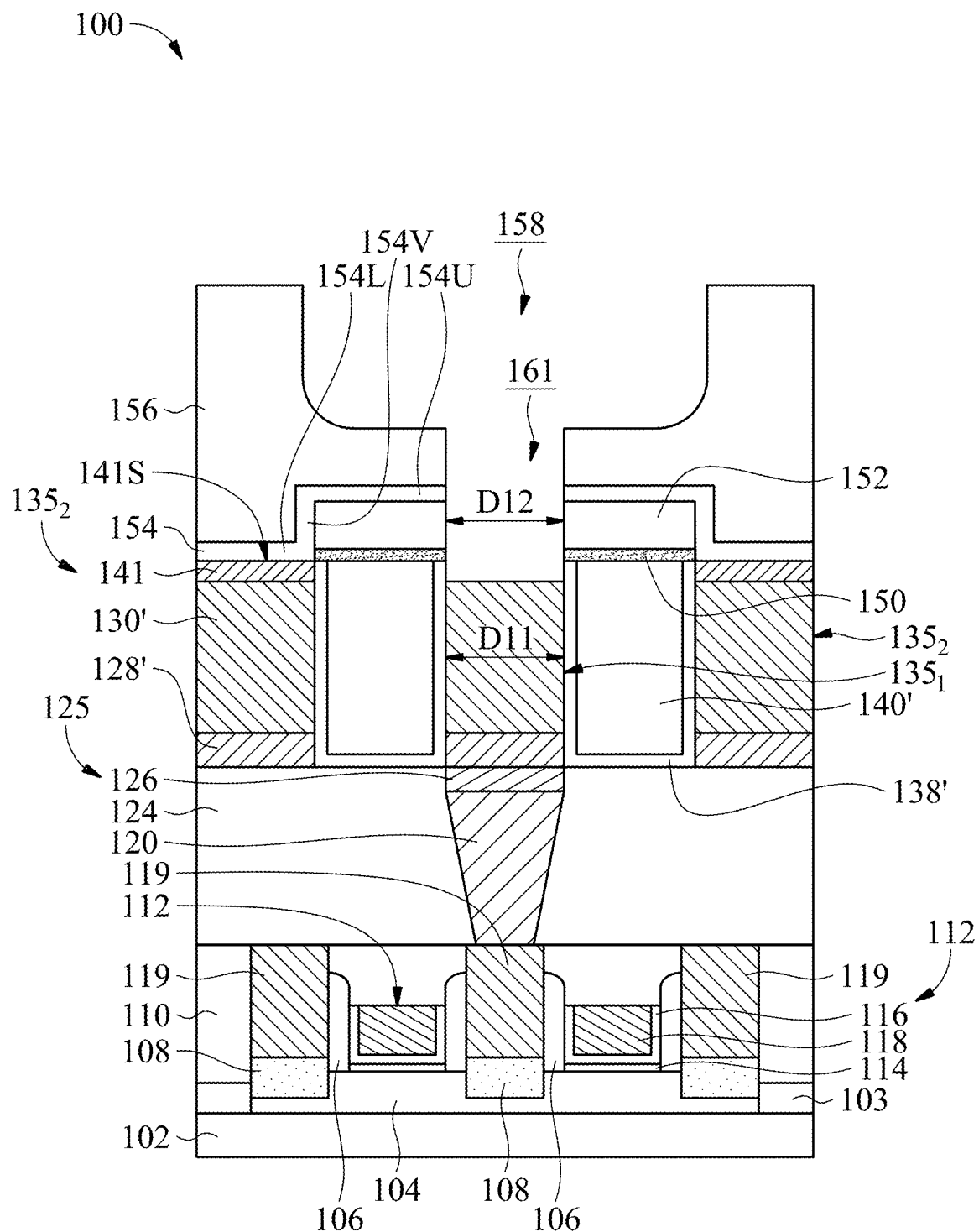
Figure 1N:
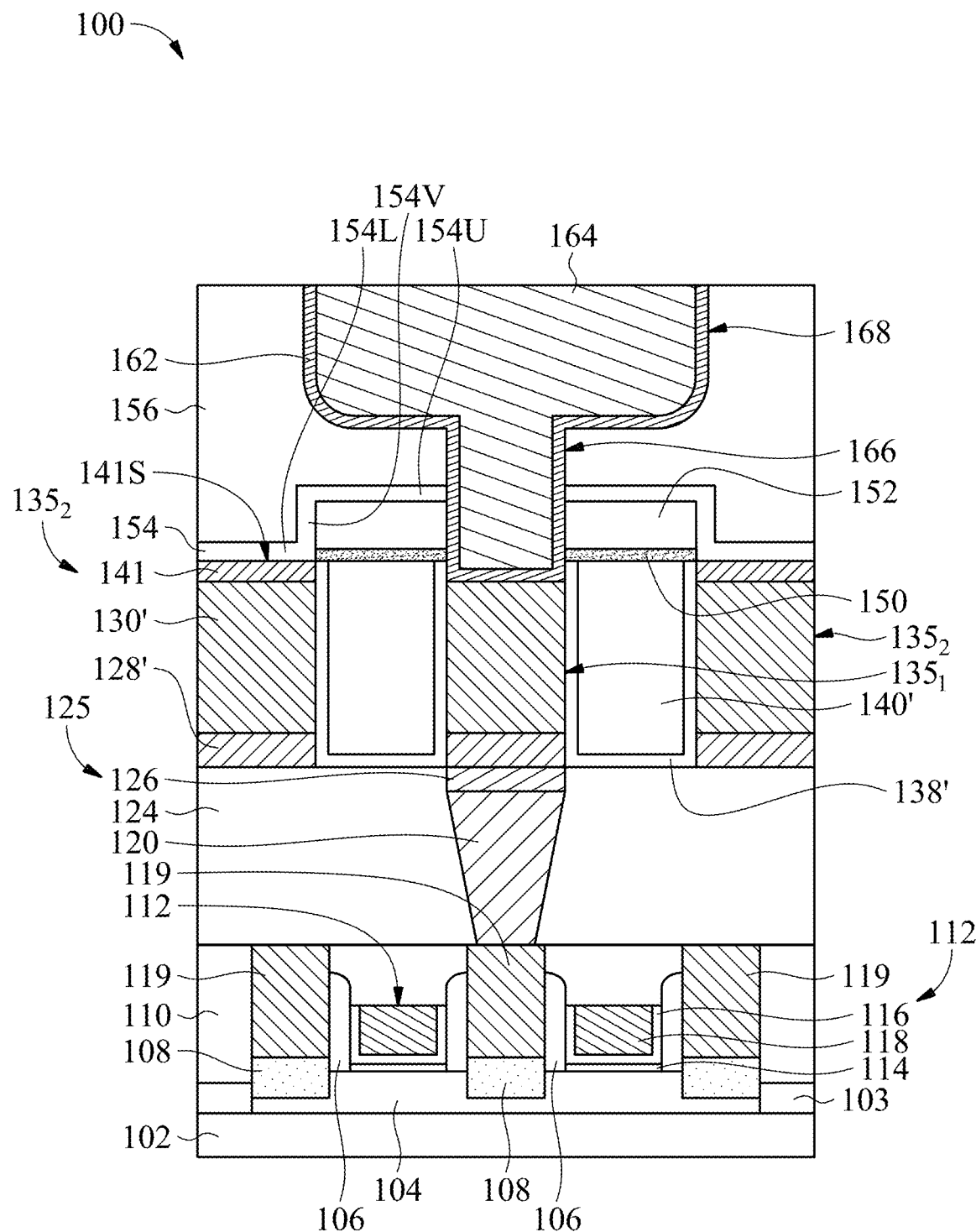

FIGS. 1A-1N are cross-sectional views illustrating the formation of a semiconductor device at various intermediate stages, in accordance with some embodiments of the disclosure. A semiconductor structure 100 is provided, as shown in FIG. 1A, in accordance with some embodiments. The semiconductor structure 100 is a portion of a FinFET device, in accordance with some embodiments. The formation of the semiconductor structure 100 includes providing a substrate 102, and forming a fin structure 104 and an isolation structure 103 on the substrate 102, in accordance with some embodiments. The isolation structure 103 surrounds a lower portion the fin structure 104, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

Though the semiconductor structure 100 is depicted with one fin structure 104, the embodiments of the present disclosure contemplate the semiconductor structure 100 having more than one fin structures 104. In some embodiments, the formation of the fin structure 104 includes recessing the substrate 102 to form trenches so that the fin structure 104 protrudes from between the trenches.

Afterward, the trenches are filled with an insulating material for the isolation structure 103, in accordance with some embodiments. The insulating material is also formed over the upper surfaces of the fin structures 104, in accordance with some embodiments. In some embodiments, the insulating material includes silicon oxide, silicon nitride, silicon oxynitride (SiON), another suitable insulating material, and/or a combination thereof. In some embodiments, the insulating material is formed using chemical vapor deposition (CVD) such as low pressure CVD (LPCVD), plasma enhanced CVD (PECVD), or high density plasma CVD (HDP-CVD), high aspect ratio process (HARP), flowable CVD (FCVD)); atomic layer deposition (ALD); another suitable method, and/or a combination thereof.

The insulating material over the upper surfaces of the fin structures 104 is removed to expose the upper surface of the fin structure 104, for example, using chemical mechanical polishing (CMP), in accordance with some embodiments. Afterward, the insulating material is further recessed to expose an upper portion of the sidewalls of the fin structures 104 and forms the isolation structure 103 that surrounds the lower portion of the fin structure 104, in accordance with some embodiments.

The formation of the semiconductor structure 100 further includes forming gate stacks 112 over a channel region of the fin structure 104, as shown in FIG. 1A, in accordance with some embodiments. In some embodiments, the gate stacks 112 extend across the fin structures 104, such that the gate stacks 112 each wrap a portion of the fin structure 104, in accordance with some embodiments. The gate stacks 112 interpose a source region and a drain region of the fin structure 104, where the channel region is defined between the source region and the drain region. The gate stacks 112 engage the channel region, such that current can flow between the source/drain regions during operation.

In some embodiments, each gate stack 112 includes an interfacial layer 114, a gate dielectric layer 116 formed on the interfacial layer 114, and a gate electrode layer 118 formed on the gate dielectric layer 116. In some embodiments, the interfacial layer 114 is made of silicon oxide ($SiO_2$). In some embodiments, the interfacial layer 114 is formed on the exposed surface of the fin structures 104 by chemical oxidation, thermal oxidation, ALD, CVD, and/or another suitable method.

In some embodiments, the gate dielectric layer 116 is made of a dielectric material with high dielectric constant (k value), for example, greater than 3.9. In some embodiments, the high-k dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or another suitable material. The high-k gate dielectric layer may be formed by ALD, physical vapor deposition (PVD), CVD, thermal oxidation, and/or another suitable method.

In some embodiments, the gate electrode layer 118 includes a conductive material, such as doped semiconductor, metal, metal alloy, or metal silicide. In some embodiments, the gate electrode layer 118 includes a single layer or alternatively a multi-layer structure, such as various combinations of a metal layer with a selected work function to enhance the device performance (work function metal layer), a liner layer, a wetting layer, an adhesion layer, a metal fill layer, and/or another suitable layer. The gate electrode layer 118 may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer 118 may be formed by ALD, PVD, CVD, e-beam evaporation, or another suitable process. Furthermore, the gate stack 112 may be formed separately for N-FET and P-FET transistors which may use different gate electrode materials and/or different work function materials.

The formation of the semiconductor structure 100 further includes forming gate spacer layers 106 over the substrate 102, as shown in FIG. 1A, in accordance with some embodiments. The gate spacer layers 106 extend along opposite sides of the gate stacks 112, in accordance with some embodiments. In some embodiments, the gate spacer layer 106 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 106 includes conformally depositing a dielectric material for the gate spacer layers 106 over the substrate 102 followed by an anisotropic etching process such as dry etching.

The formation of the semiconductor structure 100 further includes forming source/drain features 108 in the source region and the drain region of the fin structure 104, as shown in FIG. 1A, in accordance with some embodiments. The source/drain features 108 are formed on the fin structures 104 and on the opposite sides of the gate stacks 112, in accordance with some embodiments. The source/drain features 108 and the gate stack 112 between the source/drain features 108 combine to form a portion of an active device, e.g., a logic device (such as a transistor) of the resulting semiconductor device.

The formation of the source/drain features 108 includes recessing the source/drain region of the fin structures 104 to form source/drain recesses on opposite sides of the gate stacks 112, in accordance with some embodiments. The recesses may have bottom surfaces that are located at a level substantially the same as or lower than the upper surface of the isolation structure 103. Afterward, the source/drain features 108 are grown in the source/drain recesses using an epitaxial growth process, in accordance with some embodiments.

In some embodiments, the source/drain features 108 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 108 are in-situ doped during the epitaxial growth process. For example, the source/drain features 108 may be the epitaxially grown SiGe doped with boron (B). For example, the source/drain features 108 may be the epitaxially grown Si doped with carbon to form silicon: carbon (Si:C) source/drain features, phosphorous to form silicon: phosphor (Si:P) source/drain features, or both carbon and phosphorous to form silicon carbon phosphor (SiCP) source/drain features.

The formation of the semiconductor structure 100 further includes forming a lower interlayer dielectric (ILD) layer 110 over the substrate 102, as shown in FIG. 1A, in accordance with some embodiments. The lower ILD layer 110 covers the isolation structure 103, the fin structure 104, the gate stacks 112, the gate spacer layers 106, and the source/drain features 108, in accordance with some embodiments.

In some embodiments, the lower ILD layer 110 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the lower ILD layer 110 is formed using CVD (such as HDP-CVD, PECVD, or HARP), ALD, another suitable method, and/or a combination thereof. In some embodiments, the lower ILD layer 110 is a multilayer structure. For example, the lower ILD layer 110 may include an etching stop layer (ESL), e.g., silicon nitride, and one or more low-k dielectric layers, e.g., silicon oxide-based material, formed over the ESL.

In some embodiments, the semiconductor structure 100 is formed using a gate-late process. For example, before the source/drain feature 108 are formed, dummy gate structures including dummy gate dielectric layers and dummy gate electrode layers (not shown) may be formed across the fin structures 104 in the place where the gate stacks 112 are to be formed. After one of the multi-layers of the lower ILD layer 110 is formed surrounding the source/drain features 108 and the dummy gate structures, the dummy gate structures may be replaced with the gate stacks 112. The replacement process may include removing the dummy gate structures using one or more etching processes to form trenches through one of the multi-layers of the lower ILD layer 110, and forming the gate stacks 112 in the trenches. After the gate stacks 112 are formed, others of the multi-layers of the lower ILD layer 110 may be formed over the source/drain features 108 and the gate stacks 112.

The formation of the semiconductor structure 100 further includes forming a multilayer interconnect structure over the substrate 102, in accordance with some embodiments. The multilayer interconnect structure electrically couples various devices (for example, transistors, resistors, capacitors, and/or inductors) and/or components of logic devices (such as the source/drain features 108 and/or the gate stacks 112), in accordance with some embodiments.

In some embodiments, the multilayer interconnect structure includes a combination of dielectric layers and electrically conductive features. The conductive features are configured to form vertical interconnect features (providing, for example, vertical connection between features and/or vertical electrical routing), such as contact plugs and/or vias, and/or horizontal interconnect features (providing, for example, horizontal electrical routing), such as metal lines, in accordance with some embodiments. Vertical interconnect features typically connect horizontal interconnect features in different layers (or different planes) of the multilayer interconnect structure, in accordance with some embodiments. The formation of the multilayer interconnect structure is described in detail below.

Contact plugs 119 are formed through the lower ILD layer 110, as shown in FIG. 1A, in accordance with some embodiments. In some embodiments, the contact plugs 119 and the lower ILD layer 110 combine to form one interconnect layer of the multilayer interconnect structure. The contact plugs 119 land on the source/drain features 108, in accordance with some embodiments. In some embodiments, the contact plugs 119 are made of one or more conductive materials, for example, cobalt (Co), nickel (Ni), tungsten (W), titanium (Ti), tantalum (Ta), copper (Cu), aluminum (Al), ruthenium (Ru), molybdenum (Mo), TiN, TaN, and/or a combination thereof. In some embodiments, the contact plugs 119 include a silicide layer, such as WSi, NiSi, TiSi or CoSi, formed on the source/drain features 108.

In some embodiments, the formation of the contact plugs 119 includes patterning the lower ILD layer 110 to form contact openings through the lower ILD layer 110 and exposing the source/drain features 108, depositing a conductive material for the contact plugs 119 to fill the contact openings, and removing the conductive material over the upper surface of the lower ILD layer 110. In some embodiments, the conductive material is deposited using CVD, PVD, e-beam evaporation, ALD, electroplating (ECP), electroless deposition (ELD), another suitable method, or a combination thereof.

The contact plugs 119 may have a multilayer structure including, for example, metal bulk layers, liner layers, seed layers, glue layers, barrier layers, and the like. In some embodiments, the conductive material is formed using a selective deposition technique such as cyclic CVD process or ELD process, and therefore it is not necessary to form glue layer in the opening before depositing the metal bulk material. In some embodiments, if the conductive material does not easily diffuse into the dielectric material, the barrier layer may be omitted.

An upper ILD layer 120 is formed over the lower ILD layer 110 and the contact plugs 119, as shown in FIG. 1A, in accordance with some embodiments. In some embodiments, the upper ILD layer 120 is made of a dielectric material, such as USG, or doped silicon oxide such as BPSG, FSG, PSG, BSG, and/or another suitable dielectric material. In some embodiments, the upper ILD layer 120 is formed using CVD (such as HDP-CVD, PECVD, or HARP), ALD, another suitable method, and/or a combination thereof. In some embodiments, the upper ILD layer 120 is a multilayer structure. For example, the upper ILD layer 120 may include an ESL, e.g., silicon nitride, and one or more low-k dielectric layers, e.g., silicon oxide-based material, formed over the ESL.

A via 125 is formed through the upper ILD layer 120, as shown in FIG. 1A, in accordance with some embodiments. In some embodiments, the via 125 and the upper ILD layer 120 combine to form one interconnect layer of the multilayer interconnect structure that is formed over and coupled to the previous interconnect layer (including the contact plugs 119 and the lower ILD layer 110). The via 125 lands on the contact plug 119 and is coupled to the source/drain feature 108, and therefore the via 125 is also referred to as a source/drain via, in accordance with some embodiments. In some embodiments, a gate via (not shown) may be formed through the upper ILD layer 120 and the lower ILD layer 110 and lands on the gate stack 112.

The via 125 includes a metal bulk layer 124 and a metal capping layer 126 over the metal bulk layer 124, in accordance with some embodiments. In some embodiments, the metal bulk layer 124 is made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), and/or a combination thereof.

In some embodiments, the formation of the via 125 includes patterning the upper ILD layer 120 to form via hole through the upper ILD layer 120 and exposing the contact plug 119, depositing a conductive material for the metal bulk layer 124 to fill the via hole, and removing the conductive material over the upper surface of the upper ILD layer 120 using such as CMP. In some embodiments, the conductive material is deposited using CVD, PVD, ALD, another suitable method, or a combination thereof. After the removal process, the metal bulk layer 124 may have an upper surface that is substantially coplanar with or below the upper surface of the upper ILD layer 120. In some embodiments, the metal bulk layer 124 has a thickness D1 ranging from about 50 angstroms (Å) to about 500 Å.

After the metal bulk layer 124 is formed in the via hole, the metal capping layer 126 is selectively formed over the upper surface of the metal bulk layer 124, in accordance with some embodiments. The metal capping layer 126 is configured to improve the electronic migration and/or stress migration of the via 125, in accordance with some embodiments. Although FIG. 1A illustrates that the upper surface of the metal capping layer 126 is substantially coplanar with the upper surface of the upper ILD layer 120, the upper surface of the metal capping layer 126 may be slightly higher than the upper surface of the upper ILD layer 120. In some embodiments, the metal capping layer 126 has a thickness D2 ranging from about 2 Å to about 50 Å.

In some embodiments, the metal capping layer 126 is made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), and/or a combination thereof. In some embodiments, the metal capping layer 126 is made of a different conductive material than the metal bulk layer 124. In some embodiments, the metal capping layer 126 is made of the same conductive material as the metal bulk layer 124. In some embodiments, the metal capping layer 126 is deposited using CVD, PVD, ALD, another suitable method, or a combination thereof.

Furthermore, the via 125 may include, for example, liner layers, seed layers, glue layers, barrier layers, and the like on which the metal bulk layer 124 is formed. In some embodiments, the conductive material of the metal bulk layer 124 is formed using a selective deposition technique such as cyclic CVD process or ELD process, and therefore it is not necessary to form glue layer in the via hole before depositing the conductive material for metal bulk layer 124. In some embodiments, if the conductive material does not easily diffuse into the dielectric material (e.g., the upper ILD layer 120), the barrier layer may be omitted.

A glue layer 128 is formed over the upper surface of the upper ILD layer 120 and the upper surface of the via 125, as shown in FIG. 1B, in accordance with some embodiments. The glue layer 128 is configured to adhere a subsequently formed metal layer to the underlying upper ILD layer 120, in accordance with some embodiments. In some embodiments, the glue layer 128 has a thickness D3 ranging from about 2 Å to about 100 Å.

In some embodiments, the glue layer 128 is made of one or more conductive materials, for example, titanium (Ti), tantalum (Ta), titanium nitride (TiN), tantalum nitride (TaN), and/or a combination thereof. In some embodiments, the glue layer 128 is globally deposited using CVD, PVD, ALD, another suitable method, or a combination thereof.

A metal bulk layer 130 is formed over the upper surface of the glue layer 128, as shown in FIG. 1B, in accordance with some embodiments. In some embodiments, the metal bulk layer 130 has a thickness D4 ranging from about 50 Å to about 500 Å.

In some embodiments, the metal bulk layer 130 is made of a conductive material, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), an alloy thereof, and/or a combination thereof. In some embodiments, the metal bulk layer 130 is globally deposited using CVD, PVD, ALD, another suitable method, or a combination thereof.

A hard mask layer 132 is formed over the upper surface of the metal bulk layer 130, as shown in FIG. 1B, in accordance with some embodiments. In some embodiments, the hard mask layer 132 is made of a dielectric material such as SiN, SiOC, AlON, $Al_2O_3$, SiCN, SiO, SiON, SiOCN, TiO, TiN, WC, WN, ZrO, HfO, ZnO and/or a combination thereof. In some embodiments, the hard mask layer 132 is formed using CVD (such as PECVD or LPCVD), ALD, another suitable method, and/or a combination thereof.

The metal bulk layer 130 and the glue layer 128 are patterned to form metal lines 134 (including metal lines $134_1$ and $134_2$) and trenches 136, as shown in FIG. 1C, in accordance with some embodiments. The metal line $134_1$ is separated from the metal lines $134_2$ by the trenches 136, in accordance with some embodiments.

In some embodiments, the patterning process includes forming a patterned photoresist layer on the upper surface of the hard mask layer 132, and etching the hard mask layer 132 uncovered by the patterned photoresist layer. For example, a photoresist may be formed on the hard mask layer 132, such as by using spin-on coating, and patterned with a pattern corresponding to the trenches 136 by exposing the photoresist to light using an appropriate photomask. Exposed or unexposed portions of the photo resist may be removed depending on whether a positive or negative resist is used. The pattern of the photoresist may then be transferred to the hard mask layer 132, such as by using one or more suitable etch processes, thereby forming a patterned hard mask layer 132' as an etching mask. The photoresist can be removed in an ashing or a wet strip process, for example.

The patterned hard mask layer 132' may transfer the pattern to the metal bulk layer 130 and the glue layer 128 to form patterned metal bulk layer 130' and patterned glue layer 128' which may be by using one or more suitable etching processes. The etch processes may include a reactive ion etch (RIE). The etching processes may be anisotropic. In some embodiments, the etch processes create the trenches 136 through the metal bulk layer 130 and glue layers 128 and is performed until the upper ILD layer 120 is exposed from the trenches 136.

Each of the metal lines $134_1$ and $134_2$ includes the patterned metal bulk layer 130' and the patterned glue layer 128', in accordance with some embodiments. The metal line $134_1$ is located directly above and contacts the via 125, thereby being coupled to the source/drain feature 108, in accordance with some embodiments. The metal lines $134_2$ may be coupled to other components of the logic devices (such as the gate stacks 112) through other vias (such as a gate via).

An encapsulating layer 138 is conformally formed over the semiconductor structure 100, as shown in FIG. 1D, in accordance with some embodiments. The encapsulating layer 138 is conformally formed along and covers the sidewalls of the glue layer 128', the sidewalls of the metal bulk layer 130' and the upper surfaces and the sidewalls of the patterned hard mask layer 132', in accordance with some embodiments. The encapsulating layer 138 is also conformally formed along the upper surface of the upper ILD layer 120, in accordance with some embodiments. In some embodiments, the encapsulating layer 138 has a thickness D5 ranging from about 2 Å to about 100 Å.

The encapsulating layer 138 is configured to prevent moisture from a dielectric material subsequently formed in the trenches 136 from reacting with the metal lines 134, provide better adhesion of the metal lines 134 to the subsequently formed dielectric material, and/or prevent the metal atoms from the metal lines 134 from diffusing into the subsequently formed dielectric material, in accordance with some embodiments.

In some embodiments, the encapsulating layer 138 is made of a dielectric material such as silicon oxide (SiO), oxygen-doped silicon carbide (SiC:O), oxygen-doped silicon nitride (SiN:O), silicon carbon nitride (SiCN), oxygen-doped silicon carbon nitride (SiCN:O), another suitable dielectric material, or a combination thereof. In some embodiments, the encapsulating layer 138 is formed using CVD, PVD, ALD, another suitable method, or a combination thereof. In some embodiments, the encapsulating layer 138 is formed using a plasma deposition process such as PECVD to have a higher density to isolate the metal lines 134 from moisture.

An IMD layer 140 is formed over the encapsulating layer 138, as shown in FIG. 1D, in accordance with some embodiments. The IMD layer 140 is filled into trenches 136, in accordance with some embodiments.

In some embodiments, the IMD layer 140 is made of one or more dielectric materials, such as silicon oxide (SiO), silicon nitride (SiN), silicon oxynitride (SiON), dielectric material(s) with low dielectric constant (low-k) such as SiCOH, SiOCN, and/or SiOC, and/or a combination thereof. A low-k dielectric material is a dielectric material with a dielectric constant lower than about 3.9. In some embodiments, the IMD layer 140 is made of SiCOH which provides better adhesion to the encapsulating layer 138.

In some embodiments, the IMD layer 140 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 140 is a porous SiCOH that has a lower density and a lower dielectric constant than the encapsulating layer 138. In some embodiments, the IMD layer 140 is formed using CVD (such as LPCVD, HARP, and FCVD), ALD, spin-on coating, another suitable method, or a combination thereof. A post-curing process (e.g. UV curing) may be performed on the as-deposited ELK dielectric material for the IMD layer 140 to form a porous structure.

The IMD layer 140 and the encapsulating layer 138, formed over the upper surface of the metal lines 134, are removed using such as CMP, in accordance with some embodiments. The removal process exposes the upper surface of the metal bulk layer 130', and a metal capping layer 141 is selectively formed over the exposed upper surface of the metal bulk layer 130', as shown in FIG. 1E, in accordance with some embodiments. The removal process also removes the patterned mask layer 132' (FIG. 1D), in accordance with some embodiments. The metal capping layer 141, the metal bulk layer 130', and the glue layer 128' combine to form metal lines 135 (including metal lines $135_1$ and $135_2$).

The IMD layer 140 and the encapsulating layer 138 that remain in the trenches 136 are referred to as an IMD layer 140' and an encapsulating layer 138', in accordance with some embodiments. The IMD layer 140' surrounds the metal lines 135 and separates the metal lines $135_1$ from the metal lines $135_2$, in accordance with some embodiments. In some embodiments, the metal lines 135, the encapsulating layer 138', and the IMD layer 140' combine to form one interconnect layer of the multilayer interconnect structure that is formed over and coupled to the previous interconnect layer (including the via 125 and the upper ILD layer 120).

The metal capping layer 141, formed over the metal bulk layer 130', is configured to improve the electronic migration and/or stress migration of the metal lines 135, in accordance with some embodiments. Although FIG. 1E illustrates that the upper surface of the metal capping layer 141 is substantially coplanar with the upper surface of the IMD layer 140', the upper surface of the metal capping layer 141 may be slightly higher than the upper surface of the IMD layer 140'. In some embodiments, the metal capping layer 141 has a thickness D6 ranging from about 2 Å to about 50 Å.

In some embodiments, the metal capping layer 141 is made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), an alloy thereof, and/or a combination thereof. In some embodiments, the metal capping layer 141 is made of a different conductive material than the metal bulk layer 130'. In some embodiments, the metal capping layer 141 is made of the same conductive material as the metal bulk layer 130'. In some embodiments, the metal capping layer 141 is deposited using CVD, PVD, ALD, another suitable method, or a combination thereof.

A surface treatment process 1000 is performed on the semiconductor structure 100, as shown in FIG. 1F, in accordance with some embodiments. The surface treatment process 1000 modifies the surface characteristics of the metal lines 135 (i.e., the upper surface 141S of the metal capping layer 141). In some embodiments, the surface treatment process 1000 is a reduction process, e.g., a dry treatment using $H_2$, $NH_3$ and/or $N_2$ gases or plasmas, and/or a wet treatment using acetic acid and/or citric acid, thereby modifying the upper surface 141S of the metal capping layer 141 to have a reduced metal surface. In some embodiments, the surface treatment process 1000 is an oxidation process, e.g., a dry treatment using $H_2O$, $CO_2$, $NO_2$, CO, $O_2$, $O_3$ gases or plasmas, thereby modifying the upper surface 141S of the metal capping layer 141 to have an oxidized metal surface. It should be noted that whether the modified upper surface 141S of the metal capping layer 141 is a reduced metal surface or an oxidized metal surface is dependent on a subsequently formed material, which can be easily bonded thereon.

A blocking layer 142 is selectively formed on the modified upper surface 141S (FIG. 1F) of the metal capping layer 141, as shown in FIG. 1G, in accordance with some embodiments. The blocking layer 142 is a modification layer, such as self-assembled monolayer (SAM) that is only formed on the metal surface (the upper surface 141S) of the metal capping layer 141 but substantially not formed on the upper surface of the IMD layer 140' and the encapsulating layer 138', in accordance with some embodiments. As such, the upper surface of the IMD layer 140' and the encapsulating layer 138' remain exposed to the ambient atmosphere (such as air or $N_2$) after the blocking layer 142 is formed, in accordance with some embodiments. In some embodiments, the blocking layer 142 has a thickness D7 ranging from about 2 Å to about 50 Å.

The SAM of the blocking layer 142 is composed of amphiphilic organic molecules 144, in which one end of the molecule 144, a head group (anchor) 146 shows a specific affinity for a metal surface, in accordance with some embodiments. The head group 146 is connected to an alkyl chain in which a tail (terminal end) 148 can be functionalized, for example, to vary wetting and interfacial properties, in accordance with some embodiments. In some embodiments, the tail 148 is functionalized to enhance deposition selectivity of the following deposition process. For example, the tail 148 may be hydrophobic such that precursors of the following deposition process may not adhere or be anchored to the blocking layer 142 during the following deposition process.

In some embodiments, the selection of the head group depends on the application of the SAM, with the type of SAM compounds based on the utilized material of the metal capping layer 141. In some embodiments, the head group 146 includes phosphorus (P), sulfur(S), or silicon (Si). For example, the SAM (or the head group 146 of the SAM) may include an organic sulfur compound (such as thiols (e.g., dodecanethiol, alkanethiol)), an organic phosphor compound (such as ODPA (Octadecylphosphonic)), or an organic silicon compound (such as 3-Aminopropyl)triethoxysilane). The head group 146 may be in the form of phosphate, sulfate, or silane-based substances. In some embodiments, the tail 148 is an organic chain composed largely of carbon (e.g., $C_xH_y$). In some embodiments, the tail 148 includes an alkyl chain. In some embodiments, the SAM is $C_{10}$-$C_{20}$alkyl group, $C_{10}$-$C_{20}$ alkenyl group, or $C_{10}$-$C_{20}$ alkynyl group substituted with a hydrophilic functional group such as an alkoxy group, a hydroxyl group, an amine group, a thiol group, a carboxyl group, an ester group, an epoxy group, an aziridine group, a halogen group, an amide group, a sulfate group, a phosphate group, or the like.

For example, the SAM may include 1-Octadecanethiol, 1-Dodecanethiol, Stearic acid, 4-Dodecylbenzenesulfonic acid, dimethyl octadecylphosphonate, Bi(Dodecyl) Dithiophosphinic Acids, Bi(octadecyl) Dithiophosphinic Acids, Diethyl-n-Octadecylphosphonate, Octadecylphosphonic acid, Decylphosphonic acid, Tetradecylphosphonic acid, 2-mercaptobenzothiazole, 2-mercaptobenzoxazole, 2-mercaptobenzimidazole, Benzothiazol, Benzoxazole, Benzimidazole, 2-Methylbenzimidazole, 5,6-Dimethylbenzimidazole, 2-(Methylthio)benzimidazole, 1,2,3-triazole, 1,2,4-triazole, 3-Amino-1,2,4-triazole, 1-Hydroxybenzotriazole hydrate, 4-Methyl-1H-benzotriazole, 5-Methyl-1H-benzotriazole, 5,6-Dimethyl-1H-benzotriazole, 4-Hydroxy-1H-benzotriazole, Benzotriazole-1-carboxamide, 2-Methylbenzothiazole, Imidazole, Methimazole, 5-Phenyl-1H-tetrazole, Benzotriazole, 5-(3-Aminophenyl)tetrazole, 4-Amino-4H-1, 2,4-triazole, 3-Amino-5-mercapto-1,2,4-triazole, 3-Amino-5-methylthio-1H-1,2,4-triazole, 2-aminopyrimidine, 2-mercaptopyrimidine, Adenine, Hypoxanthine, Morpholine, 5-Amino-1,3,4-thiadiazole-2-thiol, Tryptophan, Histidine, 5-(Trifluoromethyl)-1H-1,2,3-benzotriazole, 1H-Benzotriazole, 1-(4-morpholinylmethyl), Phenothiazine, Purine, Melamine, Trithiocyanuric acid, 1,3,4-Thiadiazole-2,5-diamine, 3,5-Diamino-1,2,4-triazole, 5-Aminotetrazole, 3,6-Bis(methylthio)-1,2,4,5-tetrazine, Aminophylline, etc., and the like In some embodiments, the SAM of the blocking layer 142 is formed using a wet process (such as a spin-on coating process or a dipping process). For example, the SAM of the blocking layer 142 is created by chemisorption of the hydrophilic head group 146 onto the metal surface (e.g., the upper surface 141S of the metal capping layer 141), followed by a slow two-dimensional organization of hydrophobic tail 148. SAM adsorption may occur from solution by immersion of the semiconductor structure 100 into a dilute solution of an alkane thiol in ethanol. In some embodiments, the SAM of the blocking layer 142 is formed using a vapor process (such as CVD, ALD, or a molecular layer deposition (MLD)).

The head group 146 of the organic molecule 144 has a high affinity to the metal surface (e.g., the upper surface 141S of the metal capping layer 141), and thus adhere and/or anchor to the metal capping layer 141 rather than the dielectric surface of the IMD layer 140' or the encapsulating layer 138', in accordance with some embodiments. That is, the modified upper surface 141S of the metal capping layer 141 provides active sites for the head group 146 of the organic molecule 144 to adhere and/or anchor, in accordance with some embodiments. In some embodiments where the selected head group 146 of the organic molecule 144 contains sulfur (S) or silicon (Si), the upper surface 141S of the metal capping layer 141 is modified into a reduced metal surface in the surface treatment process 1000. In some embodiments where the selected head group 146 of the organic molecule 144 contains phosphorus (P), the upper surface 141S of the metal capping layer 141 is modified into an oxidized metal surface in the surface treatment process 1000. Once the open active sites provided by the modified upper surface 141S have occupied by the head group 146, the reaction of the deposition process will stop, as there are no more open active sites to which the head group 146 will adhere and/or anchor, in accordance with some embodiments.

A catalyst layer 150 is selectively formed on the upper surfaces of the encapsulating layer 138' and the IMD layer 140', as shown in FIG. 1H, in accordance with some embodiments. The catalyst layer 150 is substantially not formed over the blocking layer 142, in accordance with some embodiments. That is, the catalyst layer 150 is aligned over the IMD layer 140', but substantially not formed directly above the metal line 135, in accordance with some embodiments. As such, the upper surface of the blocking layer 142 remains exposed to the ambient atmosphere (such as air or $N_2$) after the catalyst layer 150 is formed, in accordance with some embodiments. In some embodiments, the catalyst layer 150 has a thickness D8 ranging from about 1 Å to about 10 Å.

In some embodiments, the catalyst layer 150 is made of oxides of aluminum (Al), titanium (Ti), zirconium (Zr), hafnium (Hf), yttrium (Y), another suitable metal oxide, and/or a combination thereof. The catalyst layer 150 is formed using CVD, ALD, spin-on coating, another suitable method, or a combination thereof. Because the SAM of the blocking layer 142 includes organic tails 148 that is hydrophobic, the blocking layer 142 may prevent at least one of the precursors (e.g., $H_2O$) for forming the catalyst layer 150 from adhering or anchoring to the blocking layer 142 during depositing the catalyst layer 150.

Dielectric blocks 152 are selectively formed on the upper surface of the catalyst layer 150, as shown in FIG. 1I, in accordance with some embodiments. The dielectric blocks 152 are substantially not formed over the blocking layer 142, in accordance with some embodiments. That is, the dielectric blocks 152 are aligned over the IMD layer 140' but substantially not formed directly above the metal line 135, in accordance with some embodiments. As such, the upper surface of the blocking layer 142 remains exposed to the ambient atmosphere (such as air or $N_2$) after the dielectric blocks 152 is formed, in accordance with some embodiments. In some embodiments, the dielectric blocks 152 have a thickness D9 ranging from about 2 Å to about 50 Å.

In some embodiments, the dielectric blocks 152 are made of silicon oxide-based material. In some embodiments, the dielectric blocks 152 are made of silicon oxide ($SiO_x$, wherein x is greater than 0 and less than or equal to 2) with a dielectric constant that is less than about 4.0. In some embodiments, the dielectric blocks 152 are made of a low-k dielectric material with a dielectric constant that is less about 3.5, such as carbon-and-hydrogen-doped silicon oxide (Si-COH).

The dielectric blocks 152 are formed using CVD, ALD, spin-on coating, another suitable method, or a combination thereof. In some embodiments, the deposition process uses precursors including alkoxy silanol, aryloxy silanol, and/or silicon-containing precursor with Si—$CH_3$ bonding. Because the catalyst layer 150 including metal atoms may have a high polarity to provide active sites for the silicon-containing precursor during forming the dielectric blocks 152, the catalyst layer 150 is configured to boost the deposition of the dielectric blocks 152. In cases where no catalyst layer 150 is formed, it may be difficult or take a long time for the silicon-containing precursor to form the dielectric blocks 152 to adhere and/or anchor the upper surfaces of the IMD layer 140' and/or the encapsulating layer 138. Furthermore, the organic tails 148 of the SAM of the blocking layer 142 may prevent the precursor for forming the dielectric blocks 152 from adhering or anchoring to the blocking layer 142 during the deposition process of the dielectric blocks 152.

A cleaning process 1050 is performed on the semiconductor structure 100, as shown in FIG. 1J, in accordance with some embodiments. FIG. 1J illustrates that the cleaning process 1050 removes the blocking layer 142 to expose the upper surface 141S of the metal capping layer 141 of the metal lines 135, in accordance with some embodiments. The cleaning process 1050 may remove at least a portion of the blocking layer 142. For example, the cleaning process 1050 may remove the organic tails 148 (FIG. 1I) of the organic molecules 144 of the blocking layer 142, thereby remaining the head group 146 on the upper surface 141S of the metal capping layer 141. In some embodiments, the cleaning process 1050 includes a thermal process, a plasma process, and or a wet etching process.

An etching stop layer (ESL) 154 is formed over the metal lines 135 and the dielectric blocks 152, as shown in FIG. 1K, in accordance with some embodiments. The ESL 154 is conformally formed along and covers the upper surfaces 141S of the metal capping layers 141 and the sidewalls and the upper surfaces of the dielectric blocks 152, in accordance with some embodiments. The ESL 154 includes a vertical portion 154V along the sidewalls of the dielectric blocks 152, a horizontal lower portion 154L along upper surfaces 141S of the metal capping layers 141, and a horizontal upper portion 154U along the upper surfaces of the dielectric blocks 152, in accordance with some embodiments. The horizontal upper portion 154U is located at a higher level than the horizontal lower portion 154L and connects the horizontal lower portion 154L through the vertical portion 154V, in accordance with some embodiments. In some embodiments, the etching stop layer 154 has a thickness D10 ranging from about 2 Å to about 50 Å.

Generally, an ESL may provide a mechanism to stop or slow down an etching process when forming, e.g., openings, holes, trenches, etc. The ESL 154 may be formed of a dielectric material having a different etching selectivity from adjacent layers or components. In some embodiments, the etching stop layer 154 is made of a dielectric material with a high-k dielectric constant (such as greater than about 3.9) greater than neighboring low-k dielectric materials (such as the dielectric blocks 152 and a subsequently formed IMD layer).

In some embodiments, the etching stop layer 154 is made of oxides of aluminum (Al), zirconium (Zr), hafnium (Hf), yttrium (Y), another suitable metal oxide, and/or a combination thereof. The etching stop layer 154 is globally deposited using CVD, ALD, spin-on coating, another suitable method, or a combination thereof.

An IMD layer 156 is formed over the ESL 154, as shown in FIG. 1K, in accordance with some embodiments. In some embodiments, the IMD layer 156 is made of one or more dielectric materials, such as silicon oxide (SiO), silicon nitride (SiN), silicon oxynitride (SiON), dielectric material(s) with low dielectric constant (low-k) such as SiCOH, SiOCN, and/or SiOC, and/or a combination thereof. In some embodiments, the IMD layer 156 is made of ELK dielectric material which includes carbon doped silicon oxide, amorphous fluorinated carbon, parylene, BCB, PTFE (Teflon), or silicon oxycarbide polymers (SiOC). In some embodiments, ELK dielectric materials include a porous version of an existing dielectric material, such as HSQ, porous MSQ, porous PAE, porous SiLK, or porous silicon oxide ($SiO_2$). In some embodiments, the IMD layer 156 is formed using CVD (such as LPCVD, HARP, and FCVD), ALD, spin-on coating, another suitable method, or a combination thereof. A post-curing process (e.g. UV curing) may be performed on the as-deposited ELK dielectric material for IMD layer 156 to form a porous structure.

A trench 158 and a via hole 160 are formed through the IMD layer 156, as shown in FIG. 1L, in accordance with some embodiments. A trench 158 is formed in an upper portion of the IMD layer 156, in accordance with some embodiments. The via hole 160 is formed below and connects the trench 158, in accordance with some embodiments. The via hole 160 is aligned above the metal line $135_1$, in accordance with some embodiments. The via hole 160 exposes the horizontal lower portion 154L of the ESL 154 and two adjacent vertical portions 154V of the ESL 154, in accordance with some embodiments. In some embodiments, the via hole 160 has a width D12 that is substantially equal to the width D11 of the metal line $135_1$.

The trench 158 and the via hole 160 are formed using separate patterning processes, in accordance with some embodiments. For example, the trench 158 may be formed before the via hole 160. The patterning process for forming the trench 158 may include forming a patterned mask layer (such as photoresist layer and/or hard mask layer, not shown) on the IMD layer 156. The patterned mask layer may have patterns (e.g., openings) corresponding to the trench 158. The portion of IMD layer 156 exposed from the openings of the patterned mask layer may be etched away, thereby forming the trench 158. The etch process may include a reactive ion etch (RIE), neutral beam etch (NBE), inductive coupled plasma (ICP) etch, the like, or a combination thereof. The etch processes may be anisotropic. Afterward, the patterned mask layer may be removed.

The via hole 160 may be formed using similar patterning steps as the trench 158. In some embodiments, an etching selectivity of the ESL 154 to the IMD layer 156 (e.g., the ratio of an etching rate of the IMD layer 156 to an etching rate of the ESL 154) ranges from about 6 to about 10 in the etching process for forming the via hole 160.

The bottom of the via hole 160 is opened, such that the via hole 160 extends to the metal line $135_1$, as shown in FIG. 1M, in accordance with some embodiments. The extended via hole 160 is referred to as a via hole 161, in accordance with some embodiments. The via hole 161 extends through the horizontal lower portion 154L and two adjacent vertical portions 154V of the ESL 154 and the metal capping layer 141 to expose the upper surface of the metal line $135_1$, in accordance with some embodiments. The bottom of the via hole 160 may be opened using one or more etching processes such as wet etching.

As the scale of the semiconductor devices continues to shrink, one of the design challenges of the semiconductor devices is to improve via-to-line overlay window. The horizontal upper portion 154U of the ESL 154 is aligned above the IMD layer 140' and is separated from the IMD layer 140' by the dielectric blocks 152, in accordance with some embodiments. As such, while the via hole 161 extends to and exposes the metal line $135_1$, the horizontal upper portion 154U of the ESL 154 may protect the IMD layer 140' adjacent to the metal line $135_1$ from damage due to the etching process. Therefore, the via-to-line overlay window and the TDDB window of the resulting semiconductor device may be improved, which may enhance the reliability of the resulting semiconductor device.

A metal line 168 and a via 166 are formed in the trench 158 and the via hole 161 respectively, as shown in FIG. 1M, in accordance with some embodiments. The metal line 168 is formed in an upper portion of the IMD layer 156, in accordance with some embodiments. The via 166 is formed below and connects the metal line 168, in accordance with some embodiments. The via 166 is aligned above and contacts to the metal line $135_1$, such that the metal line 168 is coupled to the source/drain feature 108 through the via 166, the metal line $135_1$, and the contact plug 125, in accordance with some embodiments. In some embodiments, the metal line 168, a via 166, the IMD layer 156, the ESL 154, and the dielectric blocks 152 combine to form one interconnect layer of the multilayer interconnect structure that is formed over and coupled to the previous interconnect layer (including the metal lines 135, the encapsulating layer 138', and the IMD layer 140').

In some embodiments, the metal line 168 and the via 166 are formed of a glue layer 162 and a metal bulk layer 164. Each of the metal line 168 and the via 166 includes the glue layer 160 and the metal bulk layer 164, in accordance with some embodiments. The glue layer 162 is configured to adhere the metal bulk layer 164 to the dielectric material of the IMD layer 156, ESL 154, and the dielectric blocks 152, in accordance with some embodiments. In some embodiments, the glue layer 162 is conformally formed along the sidewalls and the bottom surface of the trench 158 (the surfaces of the IMD layer 156 exposed from the trench 158) and the sidewalls and the bottom surface of the via hole 161 (the surfaces of the IMD layer 156, the surfaces of the ESL 154, the sidewall of the dielectric blocks 152, and the upper surface of the metal bulk layer 130' exposed from the via hole 161), and the upper surface of the IMD layer 156.

The glue layer 162 is made of one or more conductive materials, for example, titanium (Ti), tantalum (Ta), titanium nitride (TiN), tantalum nitride (TaN), and/or a combination thereof. In some embodiments, the glue layer 162 is globally deposited using CVD, PVD, ALD, another suitable method, or a combination thereof.

In some embodiments, the metal bulk layer 164 is formed on the glue layer 162 and filled into the remaining portion of the trench 158 and the via hole 161. In some embodiments, the metal bulk layer 164 is made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum, and/or a combination thereof. In some embodiments, the metal bulk layer 164 is globally deposited using CVD, PVD, ALD, another suitable method, or a combination thereof.

Afterward, the glue layer 162 and the metal bulk layer 164, formed above the upper surface of the IMD layer 156, are removed using such as CMP until the upper surface of the IMD layer 156 is exposed, in accordance with some embodiments. After the metal line 168 and the via 166 are formed, additional interconnect layers (including such as ESLs, IMD layers and electrically conductive features (e.g., metal lines and vias)) of the multilayer interconnect structure may be formed over the IMD layer 156 to produce a semiconductor device.

It is observed that since the horizontal upper portion 154U of the ESL 154, raised by the dielectric blocks 154, is away from the upper surface of the IMD layer 140 by a distance, the capacitance of the multilayer interconnect structure may be reduced. Therefore, the performance (e.g., speed) of the resulting semiconductor device including the multilayer interconnect structure may be enhanced.

Figure 2:
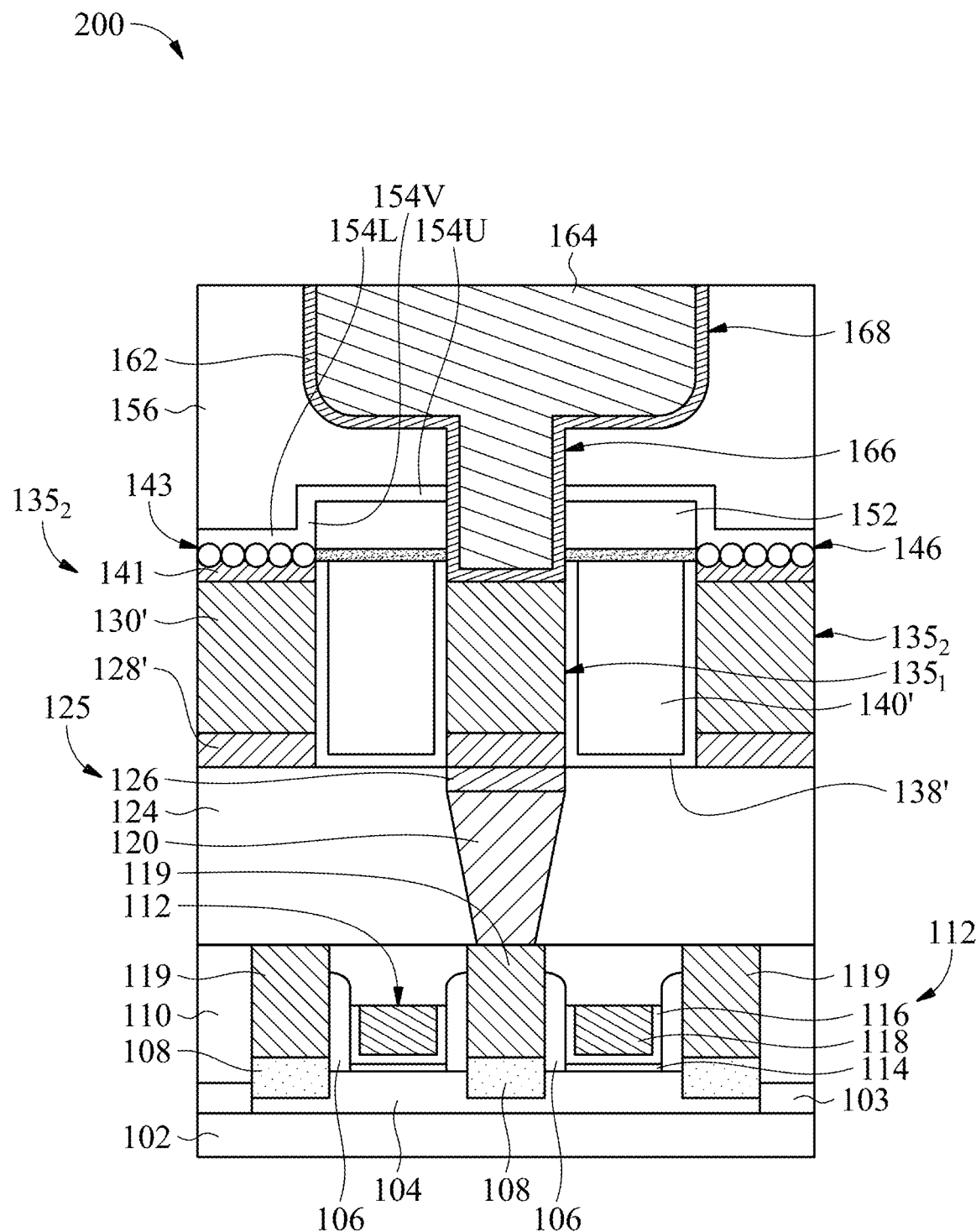
FIG. 2 is a modification of FIG. 1N in accordance with some embodiments.

FIG. 2 is a cross-sectional view of a semiconductor structure 200 that is a modification of the semiconductor structure 100 of FIG. 1N in accordance with some embodiments. The semiconductor structure 200 is similar to the semiconductor structure 100 of FIG. 1N except for the head group 146 remaining on the upper surface 141S of the metal capping layer 141, in accordance with some embodiments.

The cleaning process 1050 previously described with respect to FIG. 1J may remove at least a portion of the blocking layer 142. In some embodiments, the cleaning process 1050 removes the organic tails 148 (FIG. 1I) of the organic molecules 144 of the blocking layer 142, thereby remaining the head groups 146 of the organic molecules 144 of the blocking layer 142 on the upper surface 141S of the metal capping layer 141, in accordance with some embodiments. The remaining portion of the blocking layer 142 is referred to as a blocking layer 143. Afterward, the ESL 154 is formed to cover the blocking layer 143, and the IMD layer 156, the via 166, and the metal line 168 are formed over the ESL 154, in accordance with some embodiments.

Figure 3A:
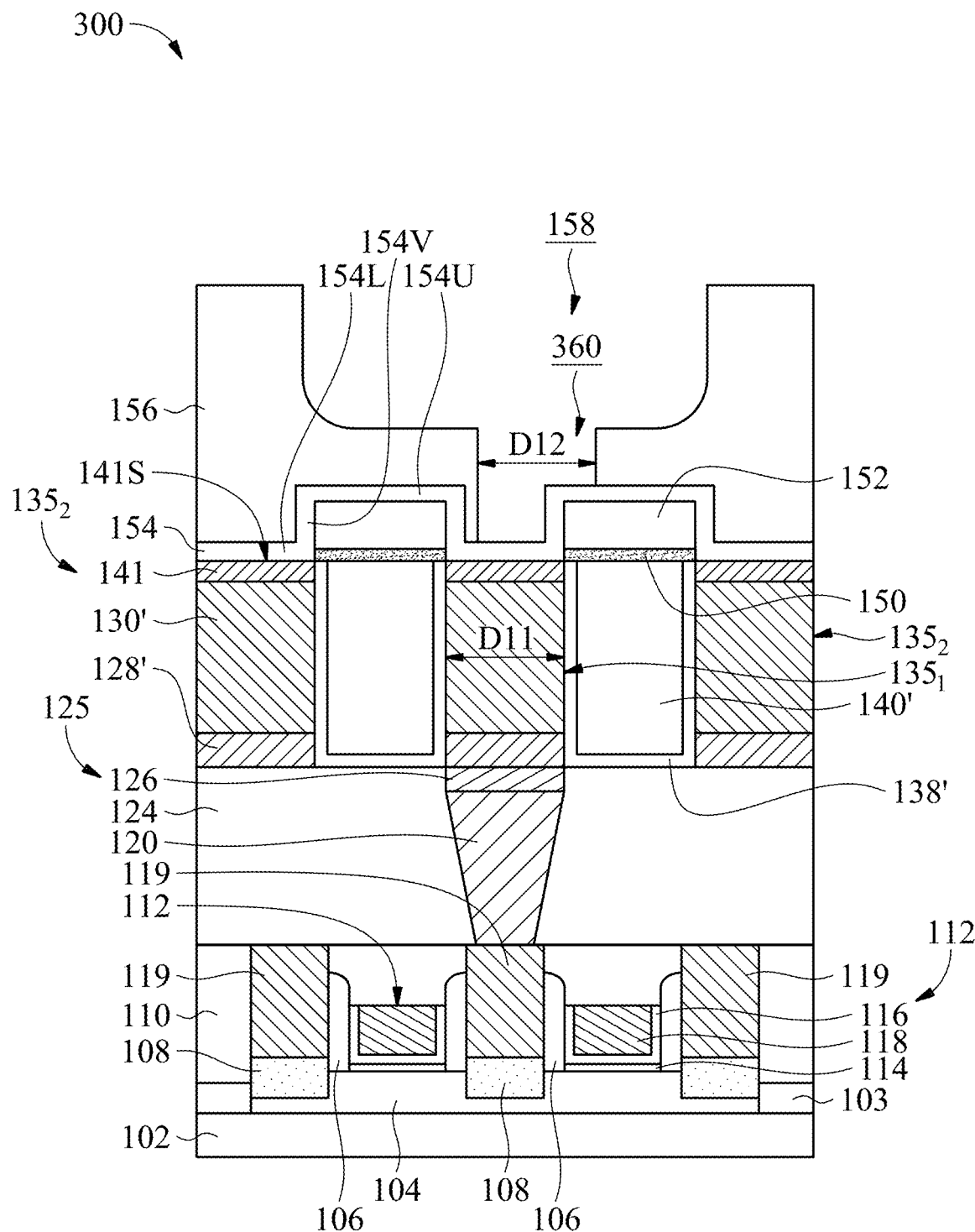
FIGS. 3A-3C are cross-sectional views illustrating the formation of a semiconductor device at various intermediate stages, in accordance with some embodiments of the disclosure.
Figure 3B:
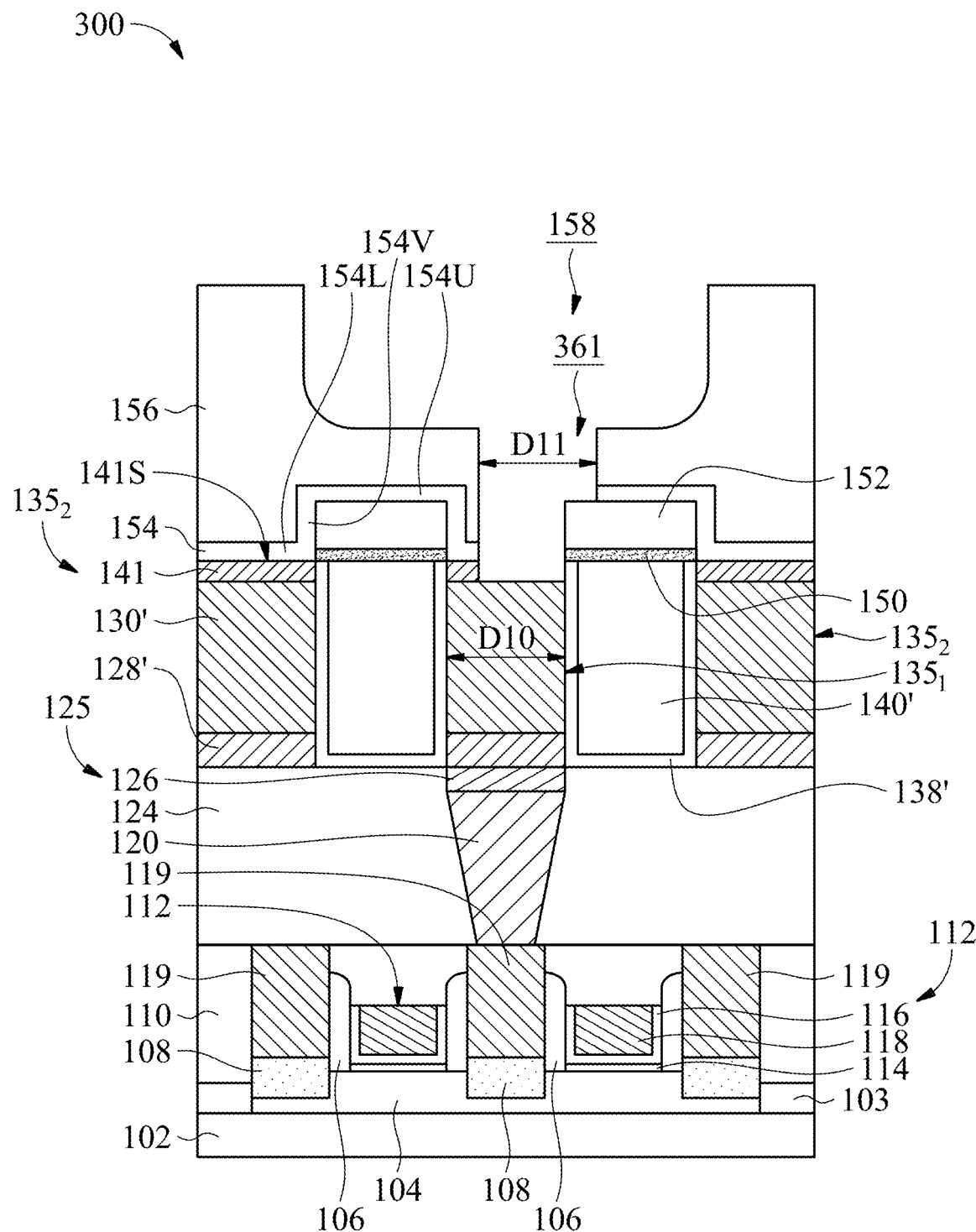
Figure 3C:
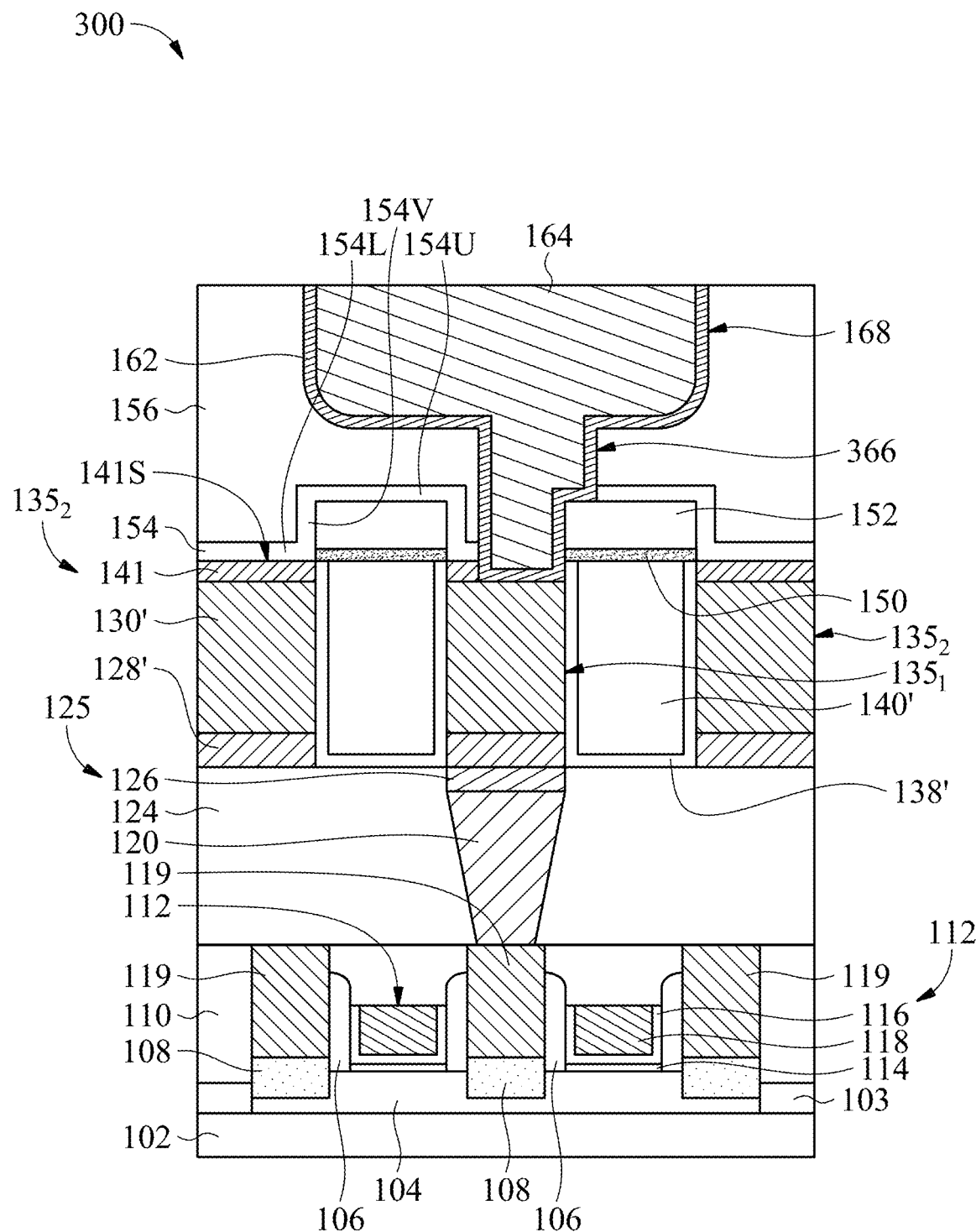

FIGS. 3A-3C are cross-sectional views illustrating the formation of a semiconductor device at various intermediate stages, in accordance with some embodiments of the disclosure. FIGS. 3A-3C illustrate a semiconductor structure 300 that is similar to the semiconductor structure 100 of FIGS. 1L-1N except for a via hole 360, in accordance with some embodiments of the disclosure.

Continuing from FIG. 1K, a trench 158 and a via hole 360 are formed through the IMD layer 156, as shown in FIG. 3A, in accordance with some embodiments. The via hole 360 is offset from the metal line $135_1$, in accordance with some embodiments of the disclosure. The via hole 360 exposes the horizontal lower portion 154L of the ESL 154 and one adjacent vertical portion 154V of the ESL 154, in accordance with some embodiments. The via hole 360 also partially exposes the horizontal upper portion 154U of the ESL 154, in accordance with some embodiments of the disclosure. In some embodiments, the via hole 360 has a width D12 that is substantially equal to the width D11 of the metal line $135_1$.

The bottom of the via hole 360 is opened to extend to the metal line $135_1$, as shown in FIG. 3B, in accordance with some embodiments. The extended via hole 360 is referred to as a via hole 361, in accordance with some embodiments. The via hole 361 extends through the horizontal lower portion 154L and the vertical portion 154V of the ESL 154 and the metal capping layer 141 to expose upper surface of the metal line $135_1$, in accordance with some embodiments. The via hole 361 also extends through the horizontal upper portion 154U of the ESL 154 to expose the upper surface of the dielectric block 152, such that the via hole 361 has a step-shape, in accordance with some embodiments.

A metal line 168 and a via 366 are formed in the trench 158 and the via hole 361 respectively, as shown in FIG. 3C, in accordance with some embodiments. The via 366 is formed below and connects the metal line 168, in accordance with some embodiments. The via 366 is offset from and contacts the metal line $135_1$, in accordance with some embodiments of the disclosure. The via 366 lands on a portion of the dielectric block 152, such that the via 366 has a step-shape, in accordance with some embodiments of the disclosure.

The horizontal upper portion 154U of the ESL 154 is aligned above the IMD layer 140' and is separated from the IMD layer 140' by the dielectric blocks 152, in accordance with some embodiments. As such, while the via hole 361 extends to and exposes the metal line $135_1$, the horizontal upper portion 154U of the ESL 154 may protect the IMD layer 140' adjacent to the metal line $135_1$ from damage due to the etching process. Therefore, the via-to-line overlay window and the TDDB window of the resulting semiconductor device may be improved, which may enhance the reliability of the resulting semiconductor device.

Figure 4A:
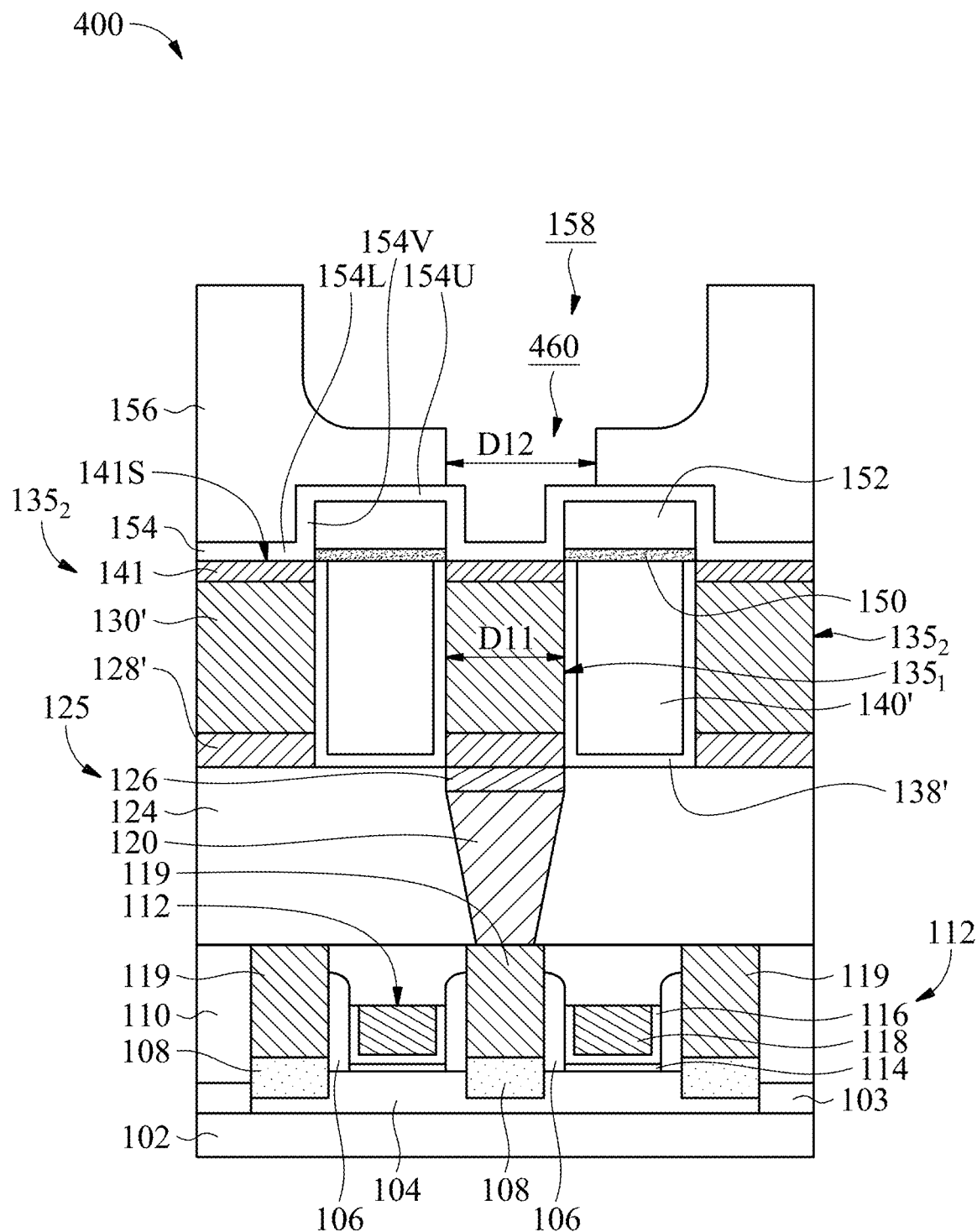
FIGS. 4A-4C are cross-sectional views illustrating the formation of a semiconductor device at various intermediate stages, in accordance with some embodiments of the disclosure.
Figure 4B:
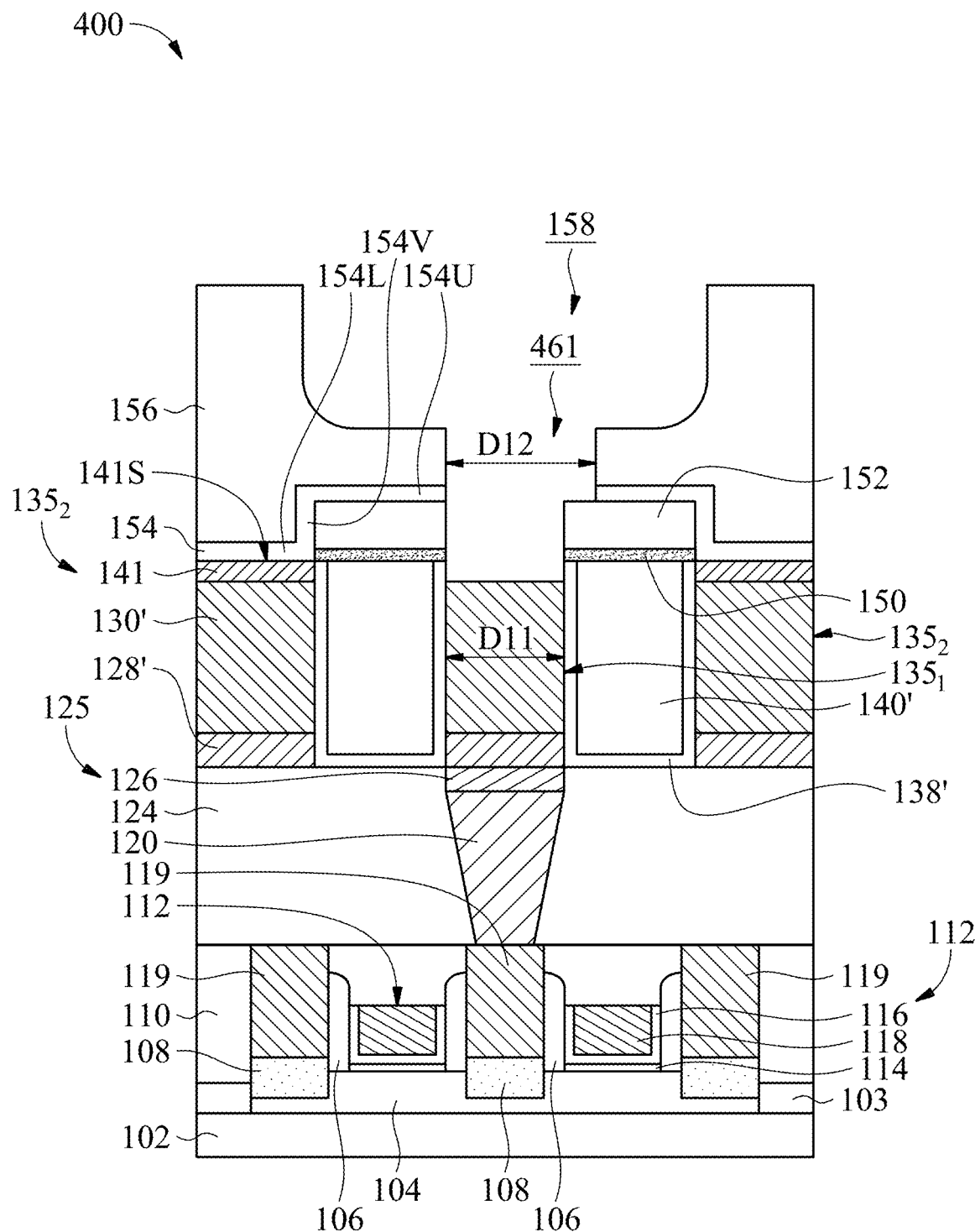
Figure 4C:
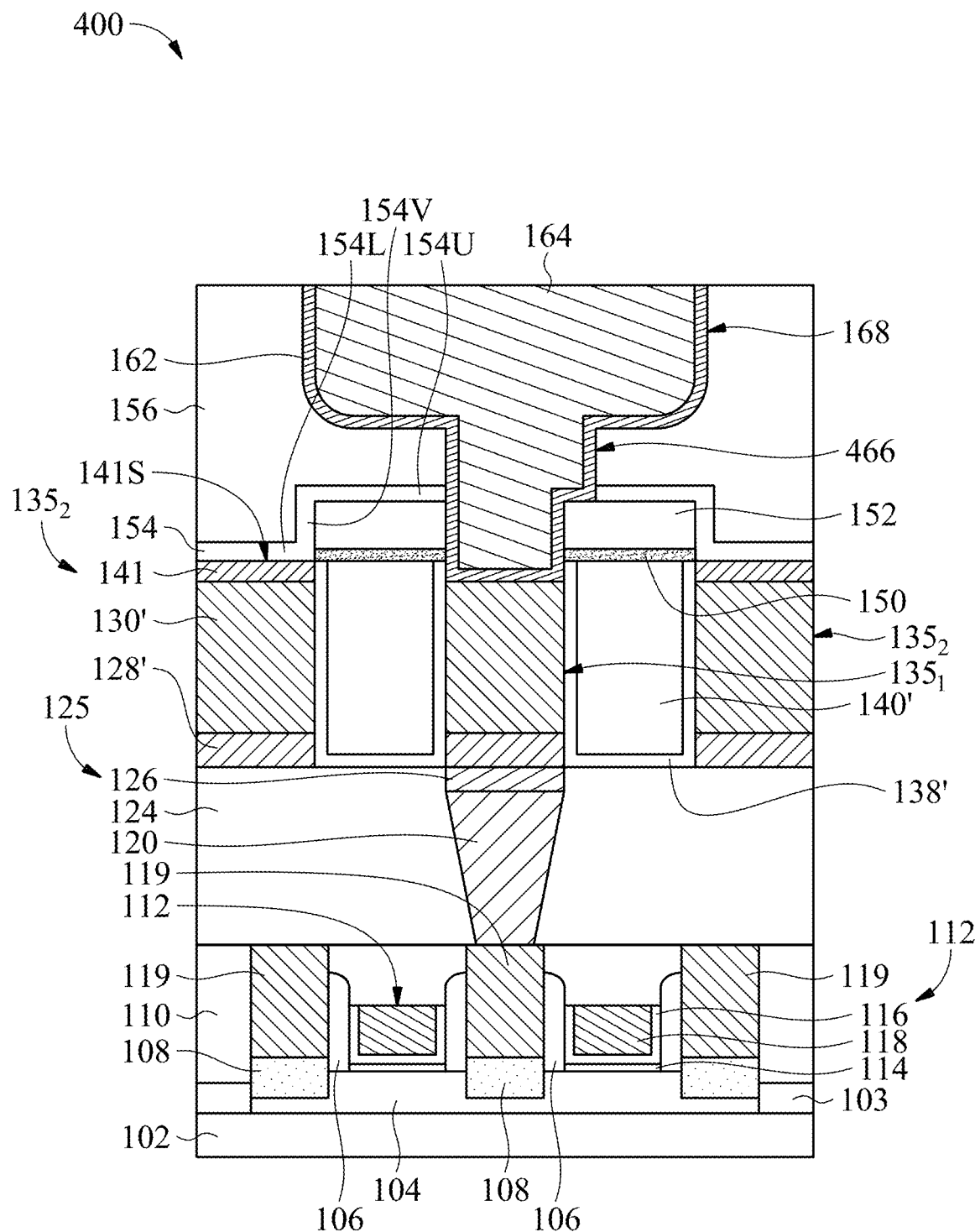

FIGS. 4A-4C are cross-sectional views illustrating the formation of a semiconductor device at various intermediate stages, in accordance with some embodiments of the disclosure. FIGS. 4A-4C illustrate a semiconductor structure 400 that is similar to the semiconductor structure 100 of FIGS. 1L-1N except for a via hole 460, in accordance with some embodiments of the disclosure.

Continuing from FIG. 1K, a trench 158 and a via hole 460 are formed through the IMD layer 156, as shown in FIG. 4A, in accordance with some embodiments. In some embodiments, the via hole 460 has a width D12 that is greater than the width D11 of the metal line $135_1$. The via hole 460 exposes the horizontal lower portion 154L of the ESL 154 and one adjacent vertical portion 154V of the ESL 154, in accordance with some embodiments. The via hole 460 also exposes the horizontal upper portion 154U of the ESL 154, in accordance with some embodiments of the disclosure.

The bottom of the via hole 460 is opened to extend to the metal line $135_1$, as shown in FIG. 4B, in accordance with some embodiments. The extended via hole 460 is referred to as via hole 461, in accordance with some embodiments. The via hole 461 extends through the horizontal lower portion 154L and two adjacent vertical portions 154V of the ESL 154 and the metal capping layer 141 to expose upper surface of the metal line $135_1$, in accordance with some embodiments. The via hole 461 also extends through the horizontal upper portion 154U of the ESL 154 to expose the upper surface of the dielectric block 152, such that the via hole 461 has a step-shape, in accordance with some embodiments.

A metal line 168 and a via 466 are formed in the trench 158 and the via hole 461 respectively, as shown in FIG. 4C, in accordance with some embodiments. The via 466 is formed below and connects the metal line 168, in accordance with some embodiments. The via 466 contacts the metal line $135_1$, in accordance with some embodiments of the disclosure. The via 466 lands on a portion of the dielectric block 152, such that the via 466 has a step-shape, in accordance with some embodiments of the disclosure.

The horizontal upper portion 154U of the ESL 154 is aligned above the IMD layer 140' and is separated from the IMD layer 140' by the dielectric blocks 152, in accordance with some embodiments. As such, while the via hole 461 extends to and exposes the metal line $135_1$, the horizontal upper portion 154U of the ESL 154 may protect the IMD layer 140' adjacent to the metal line $135_1$ from damage due to the etching process. Therefore, the via critical dimension (CD) window and the TDDB window of the resulting semiconductor device may be improved, which may enhance the reliability of the resulting semiconductor device.

As described above, the method for forming an interconnect structure includes selectively forming the dielectric block 152 over the IMD layer 140' without forming the dielectric block 152 on the metal line $134_1$, forming the ESL 154 over the dielectric block 152 and the metal line $135_1$, forming the IMD layer 156 over the ESL 154, and forming a via 166 through the IMD layer 156 and the ESL 154 to land on the metal line $134_1$. The ESL 154 may protect the IMD layer 140' adjacent to the metal line $135_1$ from damage due to the etching process for forming the via 166. As a result, the via-to-line overlay window, the via CD window, and the TDDB window of the semiconductor device may be improved, which may enhance the reliability of the semiconductor device.

Embodiments of a method for forming an interconnect structure are provided. The method for forming the interconnect structure may include selectively forming a dielectric block over a first dielectric layer without forming the dielectric block on a metal line, and etching the second dielectric layer to form a via hole corresponding to the metal line. As a result, the via-to-line overlay window, the via CD window, and the TDDB window of the semiconductor device may be improved, which may enhance the reliability of the semiconductor device.

In some embodiments, an interconnect structure is provided. The interconnect structure includes a first metal line and a second metal line in a first dielectric layer, a catalyst layer on the first dielectric layer, a dielectric block on the catalyst layer, an etching stop layer along the second metal line, the catalyst layer and the dielectric block, a second dielectric layer over the etching stop layer, and a first via through the second dielectric layer and the etching stop layer on the first metal line. A first interface between the etching stop layer and the second metal line is level to a second interface between the catalyst layer and the first dielectric layer.

In some embodiments, an interconnect structure is provided. The interconnect structure includes a first metal line, a second metal line and a third metal line surrounded by a first dielectric layer, a first dielectric block over a first portion of the first dielectric layer between the first metal line and the second metal line, a second dielectric block over a second portion of the first dielectric layer between the first metal line and the third metal line, an etching stop layer along a side surface and a top surface of the first dielectric block and a side surface and a top surface of the second dielectric block; and a via landing on the first metal line and surrounded by the first dielectric block and the second dielectric block. A first interface between the first via and the etching stop layer is aligned over a second interface between the first via and the first dielectric block.

In some embodiments, a method for forming an interconnect structure is provided. The method includes depositing a first dielectric layer to surround a metal line, forming a blocking layer on the top surface of the metal line, forming a catalyst layer on the first dielectric layer while exposing the blocking layer, forming a dielectric block on the catalyst layer while exposing the blocking layer, removing the blocking layer, forming a second dielectric layer over the dielectric block, and forming a via through the second dielectric layer and on the metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
    a first metal line and a second metal line in a first dielectric layer;
    a catalyst layer on the first dielectric layer;
    a dielectric block on the catalyst layer;
    an etching stop layer along the second metal line, the catalyst layer and the dielectric block;
    a second dielectric layer over the etching stop layer; and
    a first via through the second dielectric layer and the etching stop layer on the first metal line, wherein a first interface between the etching stop layer and the second metal line is level to a second interface between the catalyst layer and the first dielectric layer.

2. The interconnect structure as claimed in claim 1, wherein a third interface between the first via and the first metal line is lower than the second interface between the catalyst layer and the first dielectric layer.

3. The interconnect structure as claimed in claim 1, wherein the catalyst layer has a thickness ranging from about 1 Å to about 10 Å.

4. The interconnect structure as claimed in claim 1, wherein the catalyst layer is made of an oxide of aluminum, titanium, zirconium, hafnium or yttrium.

5. The interconnect structure as claimed in claim 1, wherein a dielectric constant of the dielectric block is higher than a dielectric constant of the first dielectric layer.

6. The interconnect structure as claimed in claim 1, further comprising:
    a fin field effect transistor;
    a contact plug on a source/drain region of the fin field effect transistor; and
    a second via on the contact plug, wherein the first metal line is located on the second via.

7. The interconnect structure as claimed in claim 1, wherein the first via is in direct contact with a side surface and a top surface of the dielectric block.

8. The interconnect structure as claimed in claim 1, wherein a third interface between the first via and the etching stop layer is aligned with a fourth interface between the first via and the dielectric block.

9. An interconnect structure, comprising:
    a first metal line, a second metal line and a third metal line surrounded by a first dielectric layer;
    a first dielectric block over a first portion of the first dielectric layer between the first metal line and the second metal line;
    a second dielectric block over a second portion of the first dielectric layer between the first metal line and the third metal line;
    an etching stop layer along a side surface and a top surface of the first dielectric block and a side surface and a top surface of the second dielectric block; and
    a first via landing on the first metal line and surrounded by the first dielectric block and the second dielectric block, wherein a first interface between the first via and the etching stop layer is aligned over a second interface between the first via and the first dielectric block.

10. The interconnect structure as claimed in claim 9, further comprising:
    an encapsulating layer between the first dielectric layer and the first metal line, wherein the second interface between the first via and the first dielectric block is aligned over a third interface between the encapsulating layer and the first metal line.

11. The interconnect structure as claimed in claim 9, wherein a dielectric constant of the encapsulating layer is higher than a dielectric constant of the first dielectric layer.

12. The interconnect structure as claimed in claim 9, wherein a top surface of the encapsulating layer is level to a bottom surface of the etching stop layer.

13. The interconnect structure as claimed in claim 9, further comprising:
    a blocking layer between the second metal line and the etching stop layer, wherein the blocking layer includes amphiphilic organic molecules.

14. The interconnect structure as claimed in claim 9, further comprising:
    a second dielectric layer over the etching stop layer; and
    a fourth metal line in the second dielectric layer and on the first via.

15. An interconnect structure, comprising:
    a first dielectric layer over a transistor;
    a contact plug in the dielectric layer and electrically coupling to the transistor;

a second dielectric layer over the first dielectric layer, wherein the second dielectric layer includes a first dielectric material and a second dielectric material surrounded by the first dielectric material;

a first metal line in the second dielectric layer, wherein the first metal line includes a first metal material, a second metal material and a third metal material sequentially stacked;

a dielectric block over the second dielectric layer; and a contact etching stop layer along a top surface of the third metal material of the first metal line and a sidewall and a top surface of the dielectric block, wherein the second metal material of the first metal line is separated from the contact etching stop layer by the third metal material of the first metal line.

16. The interconnect structure as claimed in claim 15, wherein a bottom surface of the etching stop layer is interfaced with the top surface of the third metal material of the first metal line, and is level to a top surface of the first dielectric material of the second dielectric layer.

17. The interconnect structure as claimed in claim 15, wherein a dielectric constant of the etching stop layer is higher than a dielectric constant of the dielectric block.

18. The interconnect structure as claimed in claim 15, wherein the dielectric block does not vertically overlap the first metal line.

19. The interconnect structure as claimed in claim 15, further comprising:

a third dielectric layer over the contact etching stop layer, wherein the third dielectric layer is separated from the dielectric block by the contact etching stop layer.

20. The interconnect structure as claimed in claim 19, further comprising:

a via in the third dielectric layer; and a second metal line on the via in the third dielectric layer, wherein the via vertically overlaps the dielectric block.

* * * * *